United States Patent

Kamiya et al.

Patent Number: 5,112,743
Date of Patent: May 12, 1992

[54] LIGHT-SENSITIVE COMPOSITION AND PRESENSITIZED PLATE FOR USE IN MAKING LITHOGRAPHIC PRINTING PLATES

[75] Inventors: Akihiko Kamiya; Akinobu Koike; Masanori Imai, all of Shizuoka, Japan

[73] Assignee: Fuji Photo Film Co., Ltd., Minami-Ashigara, Japan

[21] Appl. No.: 523,997

[22] Filed: May 16, 1990

[30] Foreign Application Priority Data

May 24, 1989 [JP] Japan .................................. 1-130493
May 31, 1989 [JP] Japan .................................. 1-137890
May 31, 1989 [JP] Japan .................................. 1-137891

[51] Int. Cl.$^5$ .................................................. G03C 1/60
[52] U.S. Cl. .................................. 430/175; 430/176; 430/281; 430/287
[58] Field of Search ................. 430/175, 176, 281, 287

[56] References Cited

U.S. PATENT DOCUMENTS

| | | | |
|---|---|---|---|
| 4,021,243 | 5/1977 | Steppan et al. | 430/176 |
| 4,334,006 | 6/1982 | Kitajima et al. | 430/175 |
| 4,492,748 | 1/1985 | Lutz et al. | 430/175 |
| 4,731,316 | 3/1988 | Tomiyasu et al. | 430/175 |
| 4,845,009 | 7/1989 | Kita et al. | 430/176 |

Primary Examiner—Paul R. Michl
Assistant Examiner—Young, Christopher G.
Attorney, Agent, or Firm—Burns, Doane, Swecker & Mathis

[57] ABSTRACT

Disclosed is a novel diazo resin which has at least one repeating unit represented by the following general formula (I):

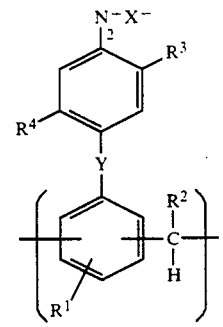

wherein $R^2$ represents a hydrogen atom, an alkyl group or an alkoxy group, a hydroxyl group, a carboxy ester group or a carboxyl group; $R^1$ represents a carboxyl group or a group having at least one carboxyl group; $R^3$ and $R^4$ each represents a hydrogen atom or an alkyl group or an alkoxy group; $X^{31}$ represents an anion; and Y represents —NH—, —O— or —S—. The diazo resin is useful for a presensitized plate for use in making a lithographic printing plate when it is incorporated into a light-sensitive layer or an underlayer on a substrate. According to the present invention, a presensitized plate using the diazo resin has excellent properties such as high sensitivity, good adhesion between the substrate and the light-sensitive layer and can thus provide a lithographic printing plate having a high printing durability and free of background contamination.

25 Claims, No Drawings

LIGHT-SENSITIVE COMPOSITION AND PRESENSITIZED PLATE FOR USE IN MAKING LITHOGRAPHIC PRINTING PLATES

BACKGROUND OF THE INVENTION

The present invention relates to a light-sensitive composition comprising a novel diazo resin which has an improved developability when it is developed with an alkali developer after imagewise exposure to light and which has also an improved adhesion to a substrate having a hydrophilic surface, as well as a presensitized plate for use in making a lithographic printing plate (hereunder referred to as "PS plate") wherein the diazo resin is used as a constituent of a light-sensitive layer or it is used as an underlayer and which can provide a lithographic printing plate free of background contamination.

Up to now, there have been used a variety of light-sensitive materials or compositions for preparing light-sensitive layers of PS plates. Most of the light-sensitive materials used for manufacturing negative-working PS plates are diazonium compounds, in particular polymeric diazonium salts (so-called diazo resins) in which at least two diazonium salt skeletons are linked.

When such a diazo resin is applied onto the surface of a proper substrate such as paper, a plastic plate or a metal plate and then exposed to actinic rays through a negative transparency, the diazo resin present on the exposed portions is decomposed and thus made insoluble in water and lipophilic. On the other hand, the surface of the substrate is exposed by dissolving out the unexposed portions with water. Therefore, if a substrate whose surface has previously been made hydrophilic is used, the unexposed resin portions are removed by development and hence the hydrophilic surface of the substrate is exposed. Thus, such portions receive water and repel ink during printing on press operation. On the other hand, the diazo resin present on the photolytically decomposed portions (exposed portions) exhibits lipophilic properties, thus repel water and receive ink. Consequently, these kind of light-sensitive materials provide so-called negative working presensitized lithographic printing plates.

The linking of the diazonium salt skeletons has conventionally been performed by condensing an aromatic diazonium compound with a reactive carbonyl group-containing organic condensation agent, in particular an aldehyde such as formaldehyde or acetaldehyde or an acetal in an acidic solvent. Most typical examples thereof are p-diazodiphenylamineformaldehyde condensates. The method for preparing the diazo resins in which the foregoing linking method is adopted are detailed in, for instance, U.S. Pat. Nos. 2,679,498; 3,050,502; 3,311,605 and 3,277,074.

If the counter anion of the diazonium salt in the diazo resins is an inorganic anion of mineral acid such as hydrochloric acid, hydrobromic acid, sulfuric acid or phosphoric acid or its complex salt with zinc chloride, the resulting diazo resins are water-soluble and thus unstable to moisture, which deteriorates their storage stability. For this reason, Japanese Patent Publication for Opposition Purpose (hereunder referred to as "J. P. KOKOKU") No. Sho 47-1167 and U.S. Pat. No. 3,300,309 propose methods for making a water-soluble diazo resin water-insoluble by reacting the diazo resin with an organic coupling agent such as a phenolic hydroxyl group-containing aromatic compound, an acidic aromatic compound or an acidic aliphatic compound, to improve its storage stability.

However, the diazo resins of this kind have insufficient solubility in organic coating solvents such as alcohols, ketones and glycol ethers. To solve this problem, i.e., to make the diazo resins of this kind water-insoluble and organic solvent-soluble, Japanese Patent Unexamined Publication (hereunder referred to as "J. P. KOKAI") Nos. Sho 54-98613 and Sho 56-121031 propose the use of diazo resins whose counter anion is selected from those derived from halogenated Lewis acids such as tetrafluoroboric acid and hexafluorophosphoric acid and perhalogenic acids such as perchloric acid and periodic acid.

Moreover, J. P. KOKAI Nos. 58-209733, Sho 62-175731 and Sho 63-262643 propose the use of an anionic surfactant, more specifically sulfonic acids having a long chain alkyl group as a counter anion for diazo resins.

However, these diazo resins are essentially alkaline water-insoluble in nature, the diazo resins are not completely removed during development with an alkaline developer and thus a part of the unexposed portions of the light-sensitive layer remains unremoved. This results in the formation of lithographic printing plates having background contamination.

On the other hand, many attempts have been made to use photopolymerizable compositions as materials for light-sensitive image-forming layers of PS plates. Such light-sensitive compositions include basic ones comprising a polymer as a binder, a monomer and a photopolymerization initiator as disclosed in U.S. Pat. No. 3,458,311; compositions whose hardening efficiency is improved by introducing unsaturated double bonds into a polymer serving as a binder such as those disclosed in J. P. KOKOKU No. Sho 49-34041; and compositions in which novel photopolymerization initiators are employed such as those disclosed in J. P. KOKOKU Nos. Sho 48-38403 and Sho 53-27605 and British Patent No. 1,388,492.

Photocrosslinkable materials which crosslink through a cyclization-addition reaction have also been well-known and have been widely employed as a principal component for light-sensitive compositions for use in making light-sensitive layer of PS plates. Useful photocrosslinkable polymers include those having a maleimido group at a side chain; and polymers having a cinnamyl, cinnamoyl, cinnamylidene, cinnamylindenacetyl and/or calcon group, which groups have a photodimerizable unsaturated double bond adjacent to the aromatic nucleus, at a side chain or in the main chain. Some of them have already been practically used. In particular, those having a relatively high sensitivity are both polymers having a maleimido group at a side chain and polyester resins which are prepared by condensing phenylene diacrylic acid or its alkyl esters with a glycol and which have a cinnamic acid skeleton in each molecular chain. From the viewpoint of safety in working environment, developers for the light-sensitive compositions containing these photocrosslinkable compounds are preferably free of organic solvents. Therefore, it has been tried to make these polymers alkaline-soluble. Such alkaline-soluble polymers are copolymers of N-[2-(methacryloyloxy)ethyl]-2,3-dimethylmaleimide with methacrylic acid or acrylic acid, as disclosed in Die Angewandte Makromolekulare Chemie, 1984, 128; and polymers having a photodimerizable functional group and a carboxyl group at a side chain, as disclosed in J. P. KOKAI Nos. Sho 62-175729, Sho 62-175730, Sho 63-25443, Sho 63-218944 and Sho 63-218945.

However, when the foregoing photopolymerizable or photocrosslinkable polymers are used for the light-sensitive layer of PS plates, the adhesion between the layer and an aluminum substrate is insufficient. As a result, the images are easily damaged and/or peeled off by, for instance, rubbing with a brush during the development (in other words, the image portions do not have sufficient strength) and are also possibly peeled off during printing (insufficient printing durability). In particular, this tendency becomes conspicuous under low exposure condition and in such a case, the sensitivity of the light-sensitive layer is reduced.

To eliminate such problems of insufficient adhesion between the light-sensitive layer and the substrate, many attempts have been made. There are proposed a variety of means for improving the adhesion, for instance, the use of a negative-working diazo resin as a material for an underlayer (see J. P. KOKAI No. Sho 54-72104 and U.S. Pat. No. 3,905,815); the addition of a diazo resin to a light-sensitive composition (J. P. KOKAI No. Sho 61-38943); the use of a negative-working diazo resin in the light-sensitive layer or as an underlayer (see J. P. KOKOKU No. Sho 50-7481 and J. P. KOKAI No. Sho 62-78544); and an attempt of using various adhesive layers, for instance, the use of underlayers of polyester resins, polyurethanes and epoxy resins. On the other hand, there have also been proposed various method for improving the adhesion of a substrate to a light-sensitive layer. For instance, J. P. KOKOKU No. Sho 46-26521 proposes the use of a substrate obtained by anodizing an oxidized layer provided on an aluminum substrate in a phosphoric acid solution; J. P. KOKAI Nos. Sho 49-8428, Sho 49-12903, Sho 49-93101 and Sho 50-138903 propose aluminum substrates which are electrolyzed in a sulfuric acid solution and then etched with phosphoric acid, polyphosphoric acid or an alkaline solution, to enlarge the pore size of an anodized layer.

However, according to the above methods in which the adhesion of the anodized layer on a substrate to a light-sensitive layer is improved, the adhesion is excessively enhanced due to anchoring effect. In addition, the non-image areas are liable to receive a printing ink during printing and to cause background contamination. Moreover, when a PS plate, for instance, one having a light-sensitive layer containing a negative-working diazo resin is developed with a developer consisting of an alkaline water, the solubility of the light-sensitive layer in an alkaline developer is insufficient and, as a result, a part of the diazo resin and the light-sensitive layer on the non-exposed portions remain unremoved. This leads to background contamination during printing.

Moreover, the light-sensitive layer of the PS plate must be easily removed from the substrate during the development while it must be firmly adhered to the substrate after the development (in the image areas) and during printing operations. However, the methods wherein a variety of adhesive layers are used cannot simultaneously satisfy the foregoing two requirements which are contrary to one another.

SUMMARY OF THE INVENTION

Accordingly, an object of the present invention is to provide a light-sensitive composition comprising a diazo resin which has an improved developability when it is developed with an alkali developer after imagewise exposing to light and which can thus provide a lithographic printing plate free of background contamination.

Another object of the present invention is to provide a light-sensitive composition comprising a diazo resin which is easily prepared at low cost.

Another object of the present invention is to provide a light-sensitive composition containing a novel diazo resin which is improved in its solubility in organic solvents and storage stability.

Another object of the present invention is to provide a novel diazo resin which is improved in adhesion to a substrate having a hydrophilic surface, when it is incorporated into a light-sensitive layer or when it is used as an underlayer.

A further object of the present invention is to provide a photopolymerizable compound-containing or photocrosslinkable polymer-containing light-sensitive composition which comprises a novel diazo resin and which is improved in adhesion to a substrate having a hydrophilic surface.

A further object of the present invention is to provide a PS plate which has an excellent adhesion between a substrate and a light-sensitive layer while maintaining an excellent sensitivity and quality of the light-sensitive layer, which can be developed with an alkaline water and which can provide a lithographic printing plate exhibiting excellent printing properties.

A further object of the present invention is to provide a negative-working PS plate which can be developed with a developer for positive-working PS plates.

A still further object of the present invention is to provide a PS plate which can be developed with an alkaline developer while maintaining excellent printing properties of the light-sensitive layer obtained from a photopolymerizable light-sensitive composition and which can provide a lithographic printing plate having good printing properties.

The inventors of this invention have conducted various studies on the conventional light-sensitive compositions and PS plates to achieve the foregoing objects of the present invention. As a result, the inventors have found out that the above objects can be easily accomplished by a novel diazo resin as stated in detail below.

According to one aspect of the present invention, there is provided a light-sensitive composition which comprises a diazo resin having at least one repeating unit represented by the following general formula (I) and an organic solvent-soluble polymeric compound.

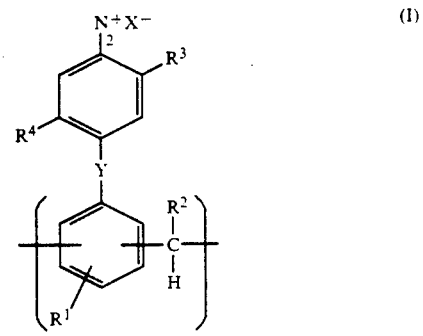

(wherein $R^1$ represents a hydrogen atom, an alkyl group, an alkoxy group, a hydroxyl group, a carboxy-ester group or a carboxyl group; $R^2$ represents a carboxyl group or a group having at least one carboxyl group; $R^3$ and $R^4$ each represents a hydrogen atom, an alkyl group or an alkoxy group; $X-$ represents an anion; and Y represents —NH—, —O— or —S—).

According to another aspect of the present invention, there is a light-sensitive composition comprising (i) the above diazo resin, (ii) a polymerizable compound having an ethylenically unsaturated bond, (iii) a photopolymerization initiator and (iv) an alkaline water-soluble or alkaline water-swellable polymer having a film-forming ability.

According to another aspect of the present invention, there is provided a light-sensitive composition comprising (i) the above diazo resin and (ii) a photocrosslinkable polymer which is alkaline water-soluble or alkaline water-swellable.

According to another aspect of the present invention, there is provided a PS plate comprising, on a support, an underlayer comprised of the above diazo resin and a light-sensitive layer, in this order, the light-sensitive layer being either (i) a layer comprising a polymerizable compound having an ethylenically unsaturated bond, a photopolymerization initiator, and an alkaline water-soluble or alkaline water-swellable polymer having a film-forming ability or (ii) a layer comprising a photocrosslinkable polymer which is alkaline water-soluble or alkaline water-swellable.

DETAILED EXPLANATION OF THE INVENTION

The present invention will hereinafter be described in more detail.

The present invention relates to a light-sensitive composition comprising a novel diazo resin represented by the above general formula (I). In the formula (I), preferred examples of $R^1$ are a hydrogen atom, an alkyl group having 1 to 5 carbon atoms, an alkoxy group having 1 to 3 carbon atoms and a hydroxyl group. Those of $R^2$ are a carboxyl group and a group having at least one carboxyl group and not more than 15 carbon atoms. Those of $R^3$ and $R^4$ are a hydrogen atom and an alkoxy group having 1 to 3 carbon atoms. Those of $X-$ are anions of inorganic and organic acids having a pKa of not more than 4.

Specific examples of the anion are those derived from acids such as hydrohalogenic acids (e.g., hydrofluoric acid, hydrochloric acid and hydrobromic acid), sulfuric acid, nitric acid, phosphoric acid (pentavalent), in particular orthophosphoric acid, inorganic iso- and hetero-polyacids (e.g., phosphotungstic acid and phosphomolybdic acid), aliphatic and aromatic phosphonic acids or half esters thereof, arsonic acid, phosphinic acid, fluorocarbonic acids (e.g., trifluoroacetic acid), amidosulfonic acids, selenic acid, borofluoric acid, hexafluorophosphoric acid, perchloric acid, aliphatic and aromatic sulfonic acids (e.g., methanesulfonic acid), fluoroalkane-sulfonic acids (e.g., trifluoromethanesulfonic acid), lauryl sulfonic acid, dioctyl sulfosuccinic acid, dicyclohexyl sulfosuccinic acid, camphorsulfonic acid, tolyloxy-3-propanesulfonic acid, nonylphenoxy-3-propanesulfonic acid, nonylphenoxy-4-butanesulfonic acid, dibutylphenoxy-3-propanesulfonic acid, diaminophenoxy-3-propanesulfonic acid, dinonylphenoxy-3-propanesulfonic acid, dibutylphenoxy-4-butanesulfonic acid, dinonylphenoxy-4-butanesulfonic acid, benzenesulfonic acid, toluenesulfonic acid, mesitylenesulfonic acid, p-chlorobenzenesulfonic acid, 2,5-dichlorobenzenesulfonic acid, sulfosalicylic acid, 2,5-dimethylbenzenesulfonic acid, p-acetylbenzenesulfonic acid, 5-nitro-o-toluenesulfonic acid, 2-nitrobenzenesulfonic acid, 3-chlorobenzenesulfonic acid, 3-bromobenzenesulfonic acid, 2-chloro-5-nitrobenzenesulfonic acid, butylbenzenesulfonic acid, octylbenzenesulfonic acid, dodecylbenzene-sulfonic acid, butoxybenzenesulfonic acid, dodecyloxybenzenesulfonic acid, 2-methoxy-4-hydroxy-5-benzoylbenzenesulfonic acid, isopropylnaphthalenesulfonic acid, butylnaphthalenesulfonic acid, hexylnaphthalenesulfonic acid, octylnaphthalenesulfonic acid, butoxynaphthalenesulfonic acid, dodecyloxynaphthalenesulfonic acid, dibutylnaphthalenesulfonic acid, dioctylnaphthalenesulfonic acid, triisopropylnaphthalenesulfonic acid, tributylnaphthalenesulfonic acid, 1-naphthol-5-sulfonic acid, naphthalene-1-sulfonic acid, naphthalene-2-sulfonic acid, 1,8-dinitronaphthalene-3,6-disulfonic acid, 4,4'-diazido-stilbene-3,3'-disulfonic acid, 1,2-naphthoquinone-2-diazido-4-sulfonic acid, 1,2-naphthoquinone-2-diazido-5-sulfonic acid, 1,2-naphthoquinone-1-diazido-4-sulfonic acid and mixture of these anions. Particularly preferred are anions of hexafluorophosphoric acid, methanesulfonic acid, dodecylbenzenesulfonic acid or 2-methoxy-4-hydroxy-5-benzoylbenzenesulfonic acid.

Y preferably represents a group: —NH—.

The diazo resin usable in the present invention may be prepared by, for instance, condensing a diazo monomer having a 4-diazodiphenylamine, 4-diazodiphenyl ether or 4-diazodiphenyl sulfide skeleton with an aldehyde or its acetal having a carboxyl group in a molar ratio preferably ranging from 1:10 to 1:0.05 and more preferably 1:2 to 1:0.2 in an acidic medium. In this condensation reaction, there may be simultaneously used a condensation agent such as an active carbonyl compound free of a carboxyl group or its acetal, for instance, formaldehyde, acetaldehyde, propionaldehyde, butylaldehyde, iso-butylaldehyde, benzaldehyde, acetone, methyl ethyl ketone or acetophenone in order to control the carboxylic acid value and the molecular weight of the resulting diazo resin. The most preferred active carbonyl compound free of a carboxyl group is formaldehyde and its molar ratio to the diazo monomer preferably ranges from 0 to 5 and more preferably 0.1 to 1. If an aldehyde having a carboxyl group and an active carbonyl compound free of a carboxyl group are simultaneously used, the diazo monomer and the aldehyde having a carboxyl group are first condensed in an acidic solvent and then a post condensation of the condensate with an active carbonyl compound free of a carboxyl group, for instance, formaldehyde or its acetals is carried out, whereby a diazo resin having a higher molecular weight can be obtained.

It is also possible to use methylol derivatives as disclosed in J.P. KOKOKU Nos. Sho 49-45322 and Sho 49-45323 or olefinically unsaturated compounds as disclosed in J.P. KOKAI No. Sho 58-187925 in place of the foregoing active carbonyl compound free of a carboxyl group or its acetal.

Specific examples of the foregoing diazo monomer are 4-diazodiphenylamine, 4'-hydroxy-4-diazodiphenylamine, 4'-methoxy-4-diazodiphenylamine, 4'-ethoxy-4-diazodiphenylamine, 4'-n-propoxy-4-diazodiphenylamine, 4'-i-propoxy-4-diazodiphenylamine, 4'-methyl-4-diazodiphenylamine, 4'-ethyl-4-diazodiphenylamine, 4'-n-propyl-4-diazodiphenylamine, 4'-i-propyl-4-diazodiphenylamine, 4'-n-butyl-4-diazodiphenylamine, 4'-hydroxymethyl-4-diazodiphenylamine, 4'-β-hydroxyethyl-4-diazodiphenylamine, 4'-γ-hydroxyproyl-4-diazodiphenylamine, 4'-methoxymethyl-4-diazodiphenylamine, 4'-ethoxymethyl-4-diazodiphenylamine, 4'-β-methoxyethyl-4-diazodiphenylamine, 4'-β-ethoxyethyl-4-diazodiphenylamine, 4'-carbomethoxy-4-diazodiphenylamine, 4'-carboethoxy-4-diazodiphenylamine, 4'-carboxy-4-diazodiphenylamine, 4-diazo-3-methoxy-diphenylamine, 4-diazo-2-methoxy-diphenylamine, 2'-methoxy-4-diazodiphenylamine, 3-methyl-4-diazodiphenylamine, 3-ethyl-4-diazodiphenylamine, 3'-methyl-4-diazodiphenylamine, 3-ethoxy-4-diazodiphenylamine, 3-hexyloxy-4-diazodiphenylamine, 3-β-hydroxyethoxy-4-diazodiphenylamine, 2-methoxy-5'-methyl-4-diazodiphenylamine, 4-diazo-3-methoxy-6-methyldiphenylamine, 3,3'-dimethyl-4-diazodiphenylamine, 3'-n-butoxy-4-diazodiphenylamine, 3,4'-dimethoxy-4-diazodiphenylamine, 2'-carboxy-4-diazodiphenylamine, 4-diazodiphenyl ether, 4'-methoxy-4-diazodiphenyl ether, 4'-methyl-4-diazodiphenyl ether, 3,4'-dimethoxy-4-diazodiphenyl ether, 4'-carboxy-4-diazodiphenyl ether, 3,3'-dimethyl-4-diazodiphenyl ether, 4-diazodiphenyl sulfide, 4'-methyl-4-diazodiphenyl sulfide and 4'-methyl-2,5-dimethoxy-4-diazodiphenyl sulfide.

Examples of the foregoing aldehyde or its acetal having a carboxyl group are preferably those represented by the following general formula (II):

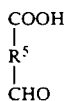

wherein $R^5$ represents a single bond or a substituted or unsubstituted organic bivalent group having 1 to 14 carbon atoms (such as aliphatic hydrocarbon groups, aromatic hydrocarbon groups or heterocyclic groups), the substituents or $R^5$ may be selected from the group consisting of, for instance, alkyl groups, aryl groups, alkoxy groups, aryoxy groups, halogen atoms, a hydroxyl group, substituted or unsubstituted amino groups, carboxy ester groups and a carboxyl group.

Specific examples of the aldehyde or its acetal having a carboxyl group are glyoxylic acid, malonaldehydic acid, succinaldehydic acid, 2-methylsuccinaldehydic acid, 2-methoxysuccin-aldehydic acid, 2-hydroxysuccinaldehydic acid, 2chloroscuccinaldehydic acid, 2-aminosuccinaldehydic acid, glutaraldehydic acid, 2-methylglutaraldehydic acid, 2-methoxyglutaraldehydic acid, 2-hydroxyglutaraldehydic acid, 2-chloroglutaraldehydic acid, adipinaldehydic acid, pimeladehydic acid, suberaldehydic acid, azelainaldehydic acid, sebacinaldehydic acid, 2-formylmethylsuccinic acid, 2-formylethylsuccinic acid, formylmethylmalonic acid, formylethylmalonic acid, N-(2-formyl-2-hydroxyethyl)glycine, N-(2-formyl-2-hydroxyvinyl)glycine, 4,6-dioxo-hexanoic acid, 6-oxo-2,4-hexadienic acid, 3-formylcyclohexanecarboxylic acid, 4-formylphenylacetic acid, malealdehydic acid, fumaraldehydic acid, dibromomalealdehydic acid, glucuronic acid, galacturonic acid, mannuronic acid, iduronic acid, guluronic acid, phthalaldehydic acid, 3,4-dimethoxyphthalaldehydic acid, isophthalaldehydic acid, terephthalaldehydic acid, 3-formyl-4-methoxybenzoic acid, 4-formylphthalic acid, 5-formylisophthalic acid, 4-formylmethylphthalic acid, 4-formylethylphthalic acid, 4-formylethoxyphthalic acid, 5-formylethoxyisophthalic acid, 4-carboxymethylphthalic acid, 3-formyl-1-naphthoic acid, 6-formyl-1-naphthoic acid and their acetals.

Examples of the acidic medium usable in the preparation of the present diazo resin are strong acids such as hydrochloric acid, sulfuric acid, phosphoric acid and methanesulfonic acid.

The medium is used in an amount of at least 30% by weight, and preferably ranging from 70 to 100% by weight. The balance of the medium in general comprises water, a part or whole of which may be replaced with an organic solvent such as methanol, acetic acid and/or N-methylpyrrolidone. Good results are obtained by the use of 85 to 93% phosphoric acid, 80% sulfuric acid, 90% methanesulfonic acid or mixture thereof.

The condensation reaction is performed at a temperature ranging from about 0° to 70° C., and preferably about 5° to 50° C.

The weight average molecular weight of the diazo resin usable in the present invention ranges from 500 to 100,000, and preferably 1,000 to 10,000.

The light-sensitive composition of the present invention usually comprises the diazo resin of the present invention in an amount ranging from 1 to 50% by weight, preferably 3 to 20% by weight, on the basis of the total weight of the composition.

The diazo resin of the present invention can be used together with a diazo resin free of a carbonyl group. The representative example is a condensate of p-diazodiphenyl amine with formaladehyde as described in, for example, U.S. Pat. Nos. 2,679,498, 3,050,502, 3,311,605 and 3,277,074.

The wieght ratio of the present diazo resin to the condensate of p-diazodiphenylamine with formaldehyde is usually 1:9 to 9:1, preferabley 1:9 to 1:2.

The present diazo resin is excellent in developability, but low in sensitivity. On the other hand, the condensate of p-diazodiphenylamine with formaldehyde is high in sensitivity, but low in developability. Therefore, the combination of these diazo resins can provide a light-sensitive composition which is high in sensitivity and excellent in developability.

The light-sensitive composition may comprise, as a binder, at least one organic solvent-soluble polymeric compound which may be selected from the group consisting of, for instance, acrylic resins, methacrylic resins, polyvinyl acetal resins, polyurethane resins, polyamide resins, epoxy resins, polystyrene type resins, polyether resins, polyester resins, polycarbonate resins and phenolic resins. The polymeric compound is used in at least alkaline developer-soluble or alkaline developer-swellable form.

Examples of such a polymeric compound are preferably copolymers obtained from the monomers (1) to (15) listed below:

(1) N-(4-hydroxyphenyl)acrylamide, N-(4-hydroxyphenyl) methacrylamide or N-(4-hydroxynaphthyl)methacrylamide;

(2) o-, m- or p-hydroxystyrene;

(3) o-, m- or p-hydroxyphenylmethacrylate; and o-, m- or p-hydroxyphenylacrylate;

(4) an unsaturated imide such as maleimide, N-acryloylacrylamide, N-acetylmethacrylamide, N-propionylmethacrylamide and N-(p-chlorobenzoyl)-methacrylamide;

(5) an unsaturated sulfonamide such as m-aminosulfonylphenyl methacrylate, N-(p-aminosulfonylphenyl)methacrylamide and N-(p-toluenesulfonyl)-methacrylamide;
(6) an unsaturated carboxylic acid such as acrylic acid, methacrylic acid, maleic anhydride and itaconic acid;
(7) an alkyl acrylate such as methyl acrylate, ethyl acrylate, propyl acrylate, butyl acrylate, amyl acrylate, hexyl acrylate, octyl acrylate, 2-chloroethyl acrylate, 2-hydroxyethyl acrylate, glycidyl acrylate and N-dimethylaminoethyl acrylate;
(8) an alkyl methacrylate such as methyl methacrylate, ethyl methacrylate, propyl methacrylate, butyl methacrylate, amyl methacrylate, cyclohexyl methacrylate, 2-hydroxyethyl methacrylate, 4-hydroxybutyl methacrylate, glycyl methacrylate, N-dimethylaminoethyl methacrylate and benzyl methacrylate;
(9) an acrylamide or methacrylamide such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;
(10) ethyl vinyl ether, 2-chloroethyl vinyl ether, hydroxyethyl vinyl ether, propyl vinyl ether, butyl vinyl ether, octyl vinyl ether and phenyl vinyl ehter;
(11) a vinyl ester such as vinyl acetate, vinyl chloroacetate, vinyl butylate and vinyl benzoate;
(12) a styrene such as styrene, α-methyl styrene, methyl styrene and chloromethyl styrene;
(13) a vinyl ketone such as methyl vinyl ketone, ethyl vinyl ketone, propyl vinyl ketone and phenyl vinyl ketone;
(14) an olefin such as ethylene, propylene, isobutylene, butadiene and isoprene; and
(15) N-vinylpyrrolidone, N-vinylcarbazole, 4-vinylpyridine, acrylonitrile and methacrylonitrile.

Moreover, these monomers may be copolymerized with another copolymerizable monomer. In addition, the binder also includes those copolymers which are further modified with, for instance, glycidyl methacrylate and/or glycidyl acrylate. However, the binder is not restricted to these specific examples.

Preferred organic solvent-soluble polymeric compounds include copolymers comprising, as essential components, acrylic acid, methacrylic acid and crotonic acid or maleic acid, such as multicomponent copolymers of 2-hydroxyethyl acrylate or 2-hydroxyethyl methacrylate/acrylonitrile or meth acrylonitrile/acrylic acid or methacrylic acid/optional another copolymerizable monomer as disclosed in U.S. Pat. No. 4,123,276; multicomponent copolymers of acrylic acid or methacrylic acid which has a terminal hydroxyl group and is esterified with a group carrying a dicarboxylic acid ester group/acrylic acid or methacrylic acid/optional another copolymerizable monomer as disclosed in J.P. KOKAI No. Sho 53-120903; multicomponent copolymers of monomers having an aromatic hydroxyl group (such as N-(4-hydroxyphenyl)methacrylamide)/acrylic acid or methacrylic acid/optional another copolymerizable monomer as disclosed in J.P. KOKAI No. Sho 54-98614 and U.S. Pat. No. 4,731,316; and multicomponent copolymers of an alkyl acrylate/acrylonitrile or methacrylonitrile/an unsaturated carboxylic acid as disclosed in U.S. Pat. No. 4,304,832. Besides, acidic polyvinyl alcohol derivatives and acidic cellulose derivatives are also useful as a binder. Moreover, other useful polymers are polymeric compounds which are obtained by making alkali-soluble polyvinyl acetals and polyurethanes, such as those disclosed in J. P. KOKOKU No. Sho 54-19773(U.S. Pat. No. 3,732,105) an J. P. KOKAI Nos. Sho 57-94747(U.S. Pat. No. 4,387,151). Sho 60-182437(U.S. Pat. No. 4,631,245), Sho 62-58242(U.S. Pat. No. 4,741,985) and Sho 62-123453(British Patent No. 2185120).

Particularly preferred polymeric compounds usable as a binder are polymeric compounds having a sulfonamido group.

Examples of such a polymeric compound having a sulfonamido group are copolymers having a structural unit derived from a monomer represented by one of the following general formulae (III) to (V), which polymeric compound in general has a molecular weight ranging from 10,000 to 200,000, preferably 20,000 to 150,000, or a polyurethane resin having a sulfonamido group which will be explained below:

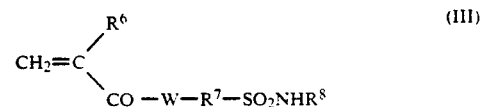

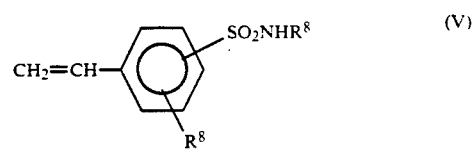

wherein $R^6$ represents a hydrogen atom or a methyl group; $R^7$ represents a $C_1$ to $C_{12}$ alkylene, cycloalkylene, arylene or aralkylene group which may have a substituent; —W— represents —O— or —N(—$R^{10}$)—; $R^8$ and $R^{10}$ each represents a hydrogen atom or a $C_1$ to $C_{12}$ alkyl, cycloalkyl, aryl or aralkyl group which may have a substituent; and $R^9$ represents a $C_1$ to $C_{12}$ alkyl, cycloalkyl, aryl or aralkyl group which may have a substituent.

Preferably, $R^7$ represents a $C_2$ to $C_6$ alkylene, cycloalkylene, substituted or unsubstituted phenylene or naphthylene group; $R^8$ represents a hydrogen atom, a $C_2$ to $C_6$ alkyl group, or a substituted or unsubstituted phenyl or naphthyl group; $R^9$ represents a $C_2$ to $C_6$ alkyl group, or a substituted or unsubstituted phenyl or naphthyl group; $R^{10}$ represents a hydrogen atom.

Examples of monomers which are copolymerized with the monomer having a sulfonamido group are those monomers (1) to (13) listed below:
(1) acrylamides, methacrylamides, acrylates, methacrylates and hydroxystyrenes having an aromatic hydroxyl group such as N-(4-hydroxyphenyl)acrylamide, N-(4-hydroxyphenyl) methacrylamide, o-, m- and p-hydroxystyrenes and o-, m- and p-hydroxyphenyl acrylates or methacrylates;
(2) acrylates and methacrylates having an aliphatic hydroxyl group such as 2-hydroxyethyl acrylate and methacrylate;
(3) unsaturated carboxylic acids and acid anhydrides such as acrylic acid, methacrylic acid, maleic anhydride, itaconic acid;

(4) (substituted) alkyl acrylates such as methyl acrylate, ethyl acrylate, propyl acrylate, butyl acrylate, amyl acrylate, hexyl acrylate, octyl acrylate, 2-chloroethyl acrylate, glycidyl acrylate and N-dimethylaminoethyl acrylate;

(5) (substituted) alkyl methacrylates such as methyl methacrylate, ethyl methacrylate, propyl methacrylate, butyl methacrylate, amyl methacrylate, cyclohexyl methacrylate, 4-hydroxybutyl methacrylate, 2-chloroethyl acrylate, glycidyl methacrylate and N-dimethylaminoethyl methacrylate;

(6) acrylamides and methacrylamides such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(7) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(8) vinyl esters such as vinyl acetate, vinyl chloroacetate, vinyl butylate and vinyl benzoate;

(9) styrenes such as styrene, α-methyl styrene, methyl styrene and chloromethyl styrene;

(10) vinyl ketones such as methyl vinyl ketone, ethyl vinyl ketone, propyl vinyl ketone and phenyl vinyl ketone;

(11) olefins such as ethylene, propylene, isobutylene, butadiene and isoprene;

(12) N-vinylpyrrolidone, N-vinylcarbazole, 4-vinylpyridine, acrylonitrile and methacrylonitrile; and

(13) unsaturated amides such as maleimide, N-acryloylacrylamide, N-acetylmethacrylamide, N-propionylmethacrylamide, N-(p-chlorobenzoyl)methacrylamide;

Moreover, these monomers may be further copolymerized with another copolymerizable monomer. In addition, the polymeric compound also includes these copolymers which are further modified with, for instance, glycidyl methacrylate and/or glycidyl acrylate. However, the polymeric compound is not restricted to these specific examples.

To the foregoing copolymers, there may be added, if necessary, other resins such as polyvinyl butyral resins, polyurethane resins, polyamide resins, epoxy resins, novolak resins and natural resins.

Among the foregoing polymeric compounds, those preferably used as a binder are copolymers listed below.

More specifically, preferably used are those comprising (a) 1 to 40 mole % of a structural unit represented by the following general formula (VI):

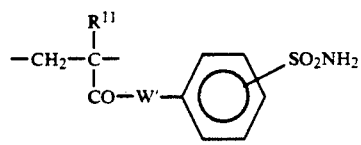

wherein $R^{11}$ represents a hydrogen atom or a methyl group; W' represents —O— or —NH—, preferably —NH—;

(b) 5 to 40 mole % of a structural unit represented by the following general formula (VII) and/or that having an alcoholic hydroxyl group:

wherein $R^{12}$ represents a hydrogen atom or a methyl group;

(c) 0 to 40 mole % of a structural unit derived from methacrylic acid and/or acrylic acid; and (d) 20 to 70 mole % of a structural unit represented by the following general formula (VIII):

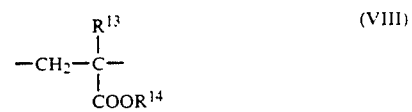

wherein $R^{13}$ represents a hydrogen atom or a methyl group; and $R^{14}$ represents an alkyl group having 1 to 12 carbon atoms, an aryl group or an aryl-substituted alkyl group; and whose weight average molecular weight ranges from 20,000 to 150,000.

Specific examples of the monomers having a sulfonamido group, which forms the structural unit represented by Formula (VI), are (meth)acrylamides such as N-(o-aminosulfonylphenyl) (meth)acrylamides, N-(m-aminosulfonylphenyl) (meth)acrylamides and N-(p-aminosulfonylphenyl) (meth)acrylamides; and (meth)acrylates such as o-aminosulfonylphenyl (meth)acrylates, m-aminosulfonylphenyl (meth)acrylates and p-aminosulfonylphenyl (meth)acrylates. Preferred are N-(p-aminosulfonylphenyl) (meth) acrylamides.

Specific examples of the monomers having a cyano group, which froms the structural unit represented by Formula (VII) are (meth)acrylonitriles, preferably acrylonitrile.

Specific examples of the monomers forming the structural unit having an alcoholic hydroxyl group are (meth)acrylates represented by the following general formula and acrylamides (IX):

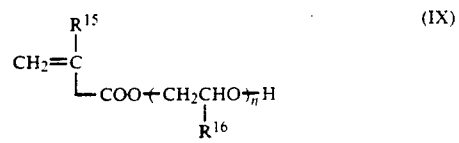

wherein $R^{15}$ represents a hydrogen atom or a methyl group; $R^{16}$ represents a hydrogen atom or a methyl, ethyl or chloromethyl group; and n is an integer ranging from 1 to 10, as disclosed in J. P. KOKOKU No. Sho 52-7364(U.S. Pat. No. 4,275,138).

Examples of (meth)acrylates include 2-hydroxyethyl (meth) acrylates, 2-hydroxypropyl (meth)acrylates and 2-hydroxypentyl (meth)acrylates; examples of (meth)acrylamides are N-methylol (meth)acrylamides and N-hydroxyethyl (meth)acrylamides. Preferred are 2-hydroxyethyl (meth)acrylates.

Specific examples of the monomers having a carboxy ester group at a side chain, which forms the structural unit represented by Formula (VIII), are ethyl acrylate, ethyl methacrylate, propyl acrylate, butyl acrylate, amyl acrylate, amyl methacrylate, hexyl acrylate, benzyl acrylate, 2-chloroethyl acrylate, phenyl acrylate, glycidyl acrylate and 2-phenoxyethyl acrylate.

The polymeric compounds having a sulfonamido group and being used as a binder in a light-sensitive composition can be prepared, for instance, in a known radical polymerization technique. For instance, they can be prepared according to solution polymerization in the presence of a radical initiator such as azoisobutyronitrile or benzoyl peroxide (in an amount ranging from 0.1 to 4.0 mole %) in a solvent selected from, for instance, ethylene dichloride, cyclohexanone, methyl ethyl ketone, acetone, methanol, ethanol, ethylene glycol monomethyl ether, 2-methoxyethyl acetate, 1-methoxy-2-propanol, 1-methoxy-2-propyl acetate, N,N-dimethylformamide, N,N-dimethylacetamide, toluene, ethyl acetate, methyl acetate, ethyl lactate and/or methyl lactate.

The organic solvent-soluble polymeric compound usable in the present invention may be used alone or as a combination thereof and its amount in the composition ranges from 40 to 99% by weight, preferably 50 to 95% by weight, on the basis of the solid content of the composition. Moreover, the amount of the light-sensitive diazo resins ranges from 1 to 60% by weight, preferably 3 to 30% by weight on the basis of the solid content of the composition.

The polyurethane resins having a sulfonamido group and being usable in the light-sensitive composition in combination with the foregoing light-sensitive diazo resins are preferably those having a sulfonamido group at a side chain and/or its main chain.

The polyurethane resins having a sulfonamido group and being preferably used in the present invention are polyurethane resins whose basic skeleton is a reaction product of a polyol compound having at least one sulfonamido group in the molecule with a polyisocyanate compound.

The polyurethane resins having a sulfonamido group which are more preferably used in the present invention are polyurethane resins whose basic skeleton is a reaction product of a diol compound having a sulfonamido group represented by one of the following general formulae (X) to (XIII) with a diisocyanate compound:

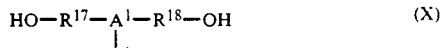  (X)

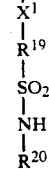

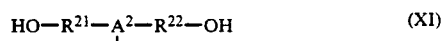  (XI)

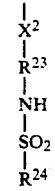

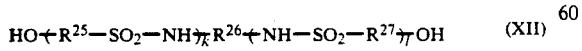  (XII)

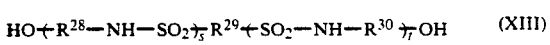  (XIII)

In the general formulae (X) to (XIII), $R^{17}$, $R^{18}$, $R_{19}$, $R^{21}$, $R^{22}$ and $R^{23}$ may be the same or different and each represents a single bond or a divalent aliphatic or aromatic group optionally having a substituent, and preferably a $C_1$ to $C_{20}$ alkylene group or a $C_6$ to $C_{15}$ arylene group. $R^{17}$, $R^{18}$, $R^{19}$, $R^{21}$ $R^{22}$ and $R^{23}$ may optionally have another functional group such as ester, urethane, amido, ureido and/or ether groups which do not have reactivity with an isocyanate group. In addition, two or three of the groups $R^{17}$, $R^{18}$, $R^{19}$, $R^{21}$, $R^{22}$ and $R^{23}$ may form a ring.

$R^{20}$ represents a hydrogen atom or an alkyl, aryl or aralkyl group optionally having a substituent and preferably a $C_1$ to $C_8$ alkyl group, a $C_6$ to $C_{15}$ aryl group or an aralkyl group.

$R^{24}$ represents an alkyl, aryl or aralkyl group optionally having a substituent and preferably a $C_1$ to $C_8$ alkyl group, a $C_6$ to $C_{15}$ aryl group or an aralkyl group.

$A^1$ and $A^2$ each represents a nitrogen atom or a trivalent $C_1$ to $C_{20}$ aliphatic or aromatic group optionally having a substituent.

$X^1$ and $X^2$ each represents a single bond or a divalent linking group consisting of at least one atom selected from the group consisting of C, H, N, O and S.

$R^{25}$, $R^{26}$, $R^{27}$, $R^{28}$, $R^{29}$ and $R^{30}$ may be the same or different and each represents a divalent hydrocarbon group optionally having a substituent and preferably a $C_1$ to $C_{20}$ alkylene group, an aralkylene group or an arylene group. These groups may optionally have another functional group such as ester, urethane, amido, ureido and/or ether groups which do not have reactivity with an isocyanate group.

k, l, s and t each is 0 or 1, provided that $k+l \neq 0$ and $s+t \neq 0$.

Specific examples of the compounds represented by Formula (X) or (XI) include p-(1,1-bis(hydroxymethyl)ethylcarbonylamino)benzene-sulfonamide, N-ethyl compound of p-(1,1-bis(hydroxymethyl)ethyl-carbonylamino)benzene-sulfonamide, N-(m-methylsulfonylaminophenyl)-2,2-bis(hydroxymethyl)propanamide, N-(p-methylsulfonylaminophenyl)-2,2-bis(hydroxymethyl)propanamide, N-(p-ethylsulfonylaminophenyl)-2,2-bis(hydroxymethyl)propanamide, N-(p-ethylsulfonylaminophenyl)-2,2-bis(hydroxymethyl)-propanamide, N-(N',N'-bis(hydroxyethyl)aminocarbonylethyl)methane-sulfonamide and N-(N',N'-bis(hydroxyethyl)aminocarbonylethyl)benzene-sulfonamide.

Examples of the compounds represented by the general formula (XII) or (XIII) are those represented by the following structural formulas:

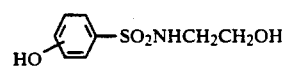  (a)

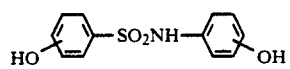  (b)

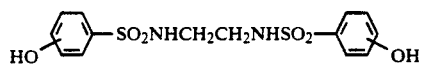  (c)

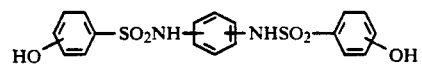  (d)

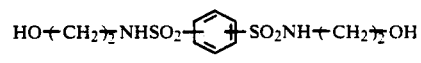  (e)

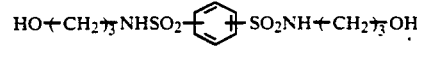  (f)

-continued

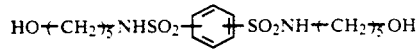

(g)

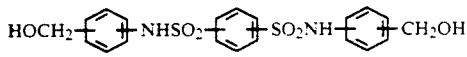

(h)

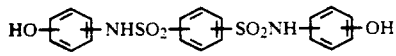

(i)

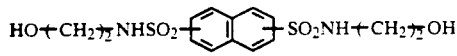

(j)

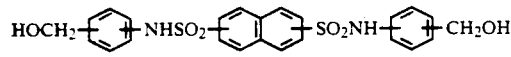

(k)

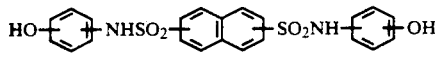

(l)

These diol compounds having a sulfonamido group may be used alone or as a combination thereof in the present invention.

In addition, it is also possible to simultaneously use diol compounds having another substituent which does not react with an isocyanate group and are free of a sulfonamido group.

Specific examples of such diol compounds include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxy-cyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxyethyl ether, p-xylylene glycol, dihydroxyethyl sulfone, bis(2-hydroxyethyl)-2,4-tolylenedicarbamate, 2,4-tolylene-bis(2-hydroxyethylcarbamide), bis(2-hydroxyethyl)-m-xylylenedicarbamate, bis(2-hydroxyethyl) isophthalate, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid and tartaric acid.

Specific examples of the diisocyanate compounds which are suitably employed in the foregoing preparation of the urethane resins include aromatic diisocyanate compounds such as 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthalene diisocyanate and 3,3'-dimethylbiphenyl-4,4'-diisocyanate; aliphatic diisocyanate compounds such as hexamethylene diisocyanate, trimethylhexamethylene diisocyanate, lysine diisocyanate and dimer acid diisocyanate; alicyclic diisocyanate compounds such as isophorone diisocyanate, 4,4'-methylenebis(cyclohexylisocyanate), methylcyclohexane-2,4 (or 2,6)-diisocyanate and 1,3-bis(isocyanatomethyl)cyclohexane; and reaction products of diols and diisocyanates such as adduct of one mole of 1,3-butylene glycol with 2 moles of tolylene diisocyanate.

The polyurethane resins usable in the present invention can be prepared by heating the foregoing diisocyanate compound and diol compound in an aprotic solvent in the presence of a known catalyst selected depending on the reactivity of the reactants. The molar ratio of the diisocyanate compound to the diol compound employed ranges from 0.8:1 to 1.2:1. In this respect, the resulting polymers often have a isocyanate group at its end, but they can be eliminated by treating the polymers with alcohols or amines.

The molecular weight of the polyurethane resins usable in the present invention is preferably not less than 2,000, more preferably from 5,000 to 300,000 as a weight average molecular weight, and not less than 1,000, more preferably from 2,000 to 250,000 as a number average molecular weight. The polydispersity index thereof (weight average molecular weight/number average molecular weight) is preferably not less than 1, more preferably 1.1 to 10. The polyurethane resins may be used alone or as a combination thereof. If the polyurethane resins are employed as a binder, the amount thereof in general ranges from about 5 to 95% by weight, preferably about 10 to 85% by weight on the basis of the weight of the solid content of the composition.

In addition to the foregoing polyurethane resins having a sulfonamido group, it is also possible to simultaneously use known alkali-soluble polymeric compounds such as phenol/formaldehyde resins, cresol/formaldehyde resins, phenol-modified xylene resins, polyhydroxystyrene, polyhalogenated hydroxystyrenes and carboxyl group-containing epoxy resins, polyacetal resins, acrylic resins, methacrylic resins and carboxyl group-containing polyurethane resins. These alkali-soluble polymeric compounds are used in an amount of not more than 70% by weight on the basis of the weight of the solid content of the composition.

The organic solvent-soluble polymeric compounds may be used alone or as a combination thereof in the present invention.

The light-sensitive composition may comprise the polymeric compounds in an amount ranging from about 50 to 99.5% by weight, preferably about 55 to 95% by weight based on the total weight of the composition.

The light-sensitive composition may further comprise various additives. For instance, it may comprise alkyl ethers such as ethyl cellulose and methyl cellulose, surfactants such as fluorine atom-containing surfactants for the purpose of improving the coating properties thereof; plasticizers for imparting flexibility and wear resistance to the resulting layer such as tricresyl phosphate, dimethyl phthalate, dibutyl phthalate, trioctyl phosphate, tributyl phosphate, tributyl citrate, polyethylene glycol and polypropylene glycol; coloring substances for dying and visualizing image portions after development such as acridine dyes, cyanine dyes, styryl dyes, triphenylmethane dyes and pigments such as phthalocyanine; and general stabilizers for the diazo resins such as phosphoric acid, phosphorous acid, pyrophosphoric acid, oxalic acid, boric acid, p-toluenesulfonic acid, benzenesulfonic acid, p-hydroxybenzenesulfonic acid, 2-methoxy-4-hydroxy-5-benzoylbenzenesulfonic acid, malic acid, tartaric acid, dipicolinic acid, polyacrylic acid and copolymers thereof, polyvinyl sulfonic acid and copolymers thereof, 5-nitronaphtalene-1-phosphonic acid, 4-chlorophenoxymethylphosphonic sodium phenyl-methyl-pyrazolone sulfonate, 2-phosphonobutane tricarboxylic acid-1,2,4, 1-phosphonoethanetricarboxylic acid-1,2,2 and 1-hydroxyethane-1,1-disulfonic acid. The amount of these additives varies depending on the kinds of the composition to which they are added and the purposes of the addition. In general, the amount ranges from 0.1 to 30% by weight on the basis of the total weight of the solid content of the light-sensitive layer.

According to another embodiment of the present invention, the present diazo resin can be incorporated into (i) a light-sensitive composition comprising a polymerizable compound having an ethylenically unsaturated bond, a photopolymerization initiator and an alkaline water-soluble or alkaline water-swellable and film-forming polymer or (ii) a light-sensitive composition comprising a photocrosslinkable polymer which is an alkaline water-soluble or an alkaline water-swellable, in order to impart an improved adhesion to a support having a hydrophilic surface.

Further, the present diazo resin can be used for an underlayer between the layer of the above light-sensitive composition and the support having a hydrophilic surface, in order to provide an improved adhesion to the support.

The polymerizable compound having an ethylenically unsaturated bond usable in the light-sensitive (photopolymerizable) composition is a compound having at least one ethylenically unsaturated bond in its chemical structure and may be in the form of monomer, prepolymers (such as dimer, trimer and other oligomers), mixture thereof or copolymers thereof. Examples thereof are unsaturated carboxylic acids and salts thereof, esters of unsaturated carboxylic acids with aliphatic polyhydric alcohols, and amides of unsaturated carboxylic acids with aliphatic polyvalent amines.

Specific examples of the unsaturated carboxylic acids are acrylic acid, methacrylic acid, itaconic acid, crotonic acid, isocrotonic acid and maleic acid. Specific examples of the salts of the unsaturated carboxylic acids are alkali metal salts of the foregoing unsaturated carboxylic acids such as sodium and potassium salts thereof.

Specific examples of the esters of unsaturated carboxylic acids with aliphatic polyhydric alcohols include acrylates such as ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate and polyester acrylate oligomers; methacrylates such as tetramethylene glycol dimethacrylate, triester glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypropoxy)phenyl]-dimethylmethane and bis[p-(methacryloxyethoxy)phenyl]-dimethylmethane; itaconates such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonates such as ethylene glycol dicrotonate, tetramethylene glycol dicrotonate, pentaerythritol dicrotonate and sorbitol tetracrotonate; isocrotonates such as ethylene glycol diisocrotonate, pentaerythritol diisocrotonate and sorbitol tetraisocrotonate; and maleates such as ethylene glycol dimaleate, triethylene glycol dimaleate, pentaerythritol dimaleate and sorbitol tetramaleate; as well as mixture of the foregoing esters.

Specific examples of the amides of unsaturated carboxylic acids with aliphatic polyvalent amines are methylenebisacrylamide, methylenebis-methacrylamide, 1,6-hexamethylenebisacrylamide, 1,6-hexamethylenebis-methacrylamide, diethylenetriaminetris-acrylamide, xylylenebis-acrylamide and xylylenebis-methacrylamide.

Specific examples thereof further include vinylurethane compounds having two or more polymerizable vinyl groups in a molecule which can be obtained by adding vinyl monomers having a hydroxyl group represented by the following general formula (A) to polyisocyanate compounds having two or more isocyanate groups in a molecule as disclosed in J. P. KOKOKU No. Sho 48-41708:

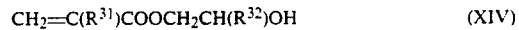

$$CH_2=C(R^{31})COOCH_2CH(R^{32})OH \qquad (XIV)$$

(in the formula (XIV), $R^{31}$ and $R^{32}$ each represents a hydrogen atom or amethyl group).

Examples of the photopolymerization initiator usable in the present invention are vicinal polyketaldonyl compounds as disclosed in U.S. Pat. No. 2,367,660; α-carbonyl compounds as disclosed in U.S. Pat. Nos. 2,367,661 and 2,367,670; acyloin ether compounds as disclosed in U.S. Pat. No. 2,448,828; aromatic acyloin compounds substituted with a hydrocarbon group at the α-position as disclosed in U.S. Pat. No. 2,722,512; polynuclear quinone compounds as disclosed in U.S. Pat. Nos. 3,046,127 and 2,951,758; a combination of triarylimidazole dimer/p-aminophenol ketone as disclosed in U.S. Pat. No. 3,549,367; benzothiazole type compounds as disclosed in U.S. Pat. No. 3,870,524; benzothiazole type compounds/trihalomethyl-s-triazine type compound as disclosed in U.S. Pat. No. 4,239,850; acridine and phenadine compounds as disclosed in U.S. Pat. No. 3,751,259; and oxadiazole compounds as disclosed in U.S. Pat. No. 4,212,970, which may be used alone or in combination. The amount of the photopolymerization initiator ranges from about 0.5% by weight to about 15% by weight, preferably 2 to 10% by weight on the basis of the total weight of the light-sensitive composition.

Examples of the alkaline water-soluble or alkaline water-swellable and film-forming polymers usable in the light-sensitive composition include copolymers of benzyl (meth) acrylate/(meth)acrylic acid/optional another addition polymerizable vinyl monomer as disclosed in J. P. KOKOKU No. Sho 59-44615 of copolymers of methacrylic acid/methyl or ethyl methacrylate-/alkyl methacrylate as disclosed in J. P. KOKOKU No. Sho 54-34327; (meth)acrylic acid copolymers as disclosed in J. P. KOKOKU Nos. Sho 58-12577 and Sho 54-25957 and J. P. KOKAI No. Sho 54-92723; copolymers of allyl (meth)acrylate/(meth)acrylic acid/optional another addition polymerizable vinyl monomer as disclosed in J. P. KOKAI No. Sho 59-53836; and maleic anhydride copolymers to which pentaerythritol triacrylate is added through half-esterification and acidic vinyl copolymers of vinyl methacrylate/methacrylic acid/optional another addition polymerizable vinyl monomer, which have a functional group selected from —COOH, —PO$_3$H$_2$, —SO$_3$H, —SO$_2$NH$_2$, —SO$_2$NH-CO— and have an acid value ranging from 50 to 200 as disclosed in J. P. KOKAI No. Sho 59-71048.

Particularly preferred are copolymers of benzyl (meth) acrylate/(meth)acrylic acid/optional another addition polymerizable vinyl monomer and copolymers of allyl (meth) acrylate/(meth)acrylic acid/optional another addition polymerizable vinyl monomer.

These polymers may be used alone or as a combination thereof. The molecular weight of these polymers may vary depending on the kinds thereof. Generally, it ranges from 5,000 to 1,000,000 and preferably 10,000 to 500,000. These polymers are used in an amount ranging from 10 to 90% by weight, preferably 30 to 85% by weight on the basis of the total weight of the light-sensitive composition.

The photocrosslinkable polymers usable in the light-sensitive composition are, for instance, polymers having a maleimido group, a cinnamyl group, a cinnamoyl group, a cinnamylidene group, a cinnamylideneacetyl group and/or a calcon group at a side chain or in a main chain.

The polymers having a maleimido group includes, for instance, those having, at a side chain, a maleimido group represented by the following general formula (XV):

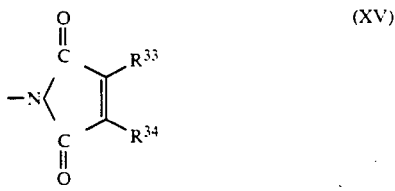

(wherein R$^{33}$ and R$^{34}$ each independently represents an alkyl group having at most 4 carbon atoms or R$^{33}$ and R$^{34}$ may be bonded together to form a 5- or 6-membered carbon ring), as disclosed in J. P. KOKAI No. Sho 52-988 (corresponding to U.S. Pat. No. 4,079,041), German Patent No. 2,626,769, European Patent Nos. 21,019 and 3,552 and Die Angewandte Makromolekulare Chemie, 1983, 115, pp. 163–181; and those having, at a side chain, a maleimido group represented by the following general formula (XVI):

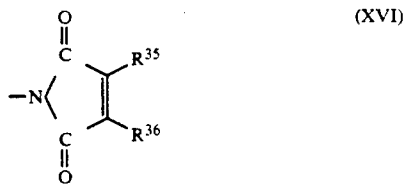

(wherein R$^{35}$ represents an aromatic group; R$^{36}$ represents a hydrogen atom, a halogen atom, an alkyl group or a cyano group), as disclosed in J.P. KOKAI Nos. Sho 49-128991, Sho 49-128992, Sho 49-128993, Sho 50-5376, Sho 50-5377, Sho 50-5378, Sho 50-5379, Sho 50-5380, Sho 53-5298, Sho 53-5299, Sho 53-5300, Sho 50-50107, Sho 51-47940, Sho 52-13907, Sho 45076, Sho 52-121700, Sho 50-10884 and Sho 50-45087 and German Patent Nos. 2,349,948 and 2,616,276.

The average molecular weight of these polymers is not lower than 1,000, preferably 30,000 to 40,000. Moreover, these polymers have, at a side chain, at least two maleimido groups per molecule on the average.

These polymers having a maleimido group at a side chain can be made alkaline water-soluble or alkaline water-swellable by incorporating an acid group into them.

Specific examples of such an acid group are a carboxyl group, a sulfonic acid group, a phosphoric acid group, a phosphonic acid group, as well as these groups which are in the form of alkali metal salts, ammonium salts and other acid groups having a pKa value ranging from 6 to 12 such as —SO$_2$NHCO—, —CONHCO—, —SO$_2$NHCOO— and p-hydroxyphenyl group. These ploymers can be easily prepared by copolymerizing a monomer having the acid group with a monomer having a maleimido group in a molar ratio, for instance, ranging from 10/90 to 50/50, preferably 20/80 to 40/60. The acid value of the maleimido polymers having an acid group preferably ranges from 30 to 300, more preferably 50 to 250. Examples of preferred copolymerizable monomers having an acid group are vinyl monomers having a carboxyl group such as acrylic acid and methacrylic acid and acid anhydrides such as maleic anhydride and itaconic anhydride.

Among these polymers having an acid group, useful are copolymers of N-[2-methacryloyloxy)ethyl]-2,3-dimethylmaleimide with methacrylic acid or acrylic acid as disclosed in Die Angewandte Makromolekulare Chemie, 1983, 128, pp. 71–79. Moreover, depending on the purposes, any multicomponent copolymers may be easily prepared by copolymerizing a third vinyl monomer when the foregoing copolymers are prepared. For instance, flexibility can be imparted to the resulting copolymers when alkyl methacrylates or alkyl acrylates, which from homopolymers having a glass transition point of not more than room temperature, are used as a third vinyl monomer component.

Examples of other photocrosslinkable polymers having a cinnamyl group, a cinnamoyl group, cinnamylidene group, a cinnamylideneacetyl group and/or a chalcone group at a side chain or in the main chain and having the following light-sensitive group, in the main chain:

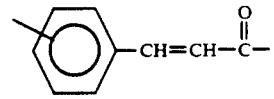

include light-sensitive polyesters such as those described in U.S. Pat. No. 3,030,208 and U.S. Patent Application Seri. Nos. 709,496 and 828,455. These polyesters can be prepared by condensing suitable polycarboxylic acids or lower alkyl esters or chlorides of suitable polycarboxylic acids with suitable polyhydric alcohols in the presence of an esterification catalyst.

Examples of those polymers which are made alkaline water-soluble include light-sensitive polymers obtained by reacting chain extenders, which have at least two functional groups capable of reacting with a hydroxyl group per molecule (such as diisocyanate compounds, diphenyl terephthalate, diphenyl carbonate and terephthaloylbis(N-caprolactam)), with polyester prepolymers which have a photodimerizable unsaturated double bond adjacent to the aromatic nucleus in the main chain, a carboxyl group at a side chain, and a hydroxyl group at an end, as disclosed in J.P. KOKAI No. Sho 60-191244; and light-sensitive polymers obtained by reacting chain extenders such as pyromellitic acid dianhydride or cyclopentanetetracarboxylic acid dianhydride with polyester prepolymers or polyurethane prepolymers which have a photodimerizable unsaturated double bond adjacent to the aromatic nucleus in the main chain and a hydroxyl group at an end and then introducing a carboxyl group into the side chain.

Further, it is also possible to use alkaline water-soluble or alkaline water-swellable light-sensitive polymers which have both a photodimerizable functional group and a carboxyl group at a side chain and an acid value ranging from 20 to 200. These light-sensitive polymers are, for instance, disclosed in J.P. KOKAI Nos. Sho 62-175729, Sho 62-175730, Sho 63-25443, Sho 63-218944 and Sho 63-218945.

The photocrosslinkable polymers usable in the light-sensitive composition desirably have a molecular weight of not lower than 1,000, preferably 10,000 to 500,000, in particular 20,000 to 300,000.

The foregoing photocrosslinkable polymers are added to the light-sensitive composition in an amount ranging from 10 to 99% by weight on the basis of the total weight of the composition.

In this embodiment, the present diazo resin is incorporated into the light-sensitive composition in an amount ranging from 0.1 to 30% by weight, preferably 1 to 10% by weight, on the basis of the total weight of the light-sensitive composition.

In addition to the diazo resin of the present invention, the light-sensitive composition may further comprise other diazo resins such as those disclosed in J.P. KOKOKU Nos. Sho 47-1167 and Sho 52-7364, J.P. KOKAI Nos. Sho 50-118802 and Sho 59-222834 in an amount of not more than 50% by weight, on the basis of the weight of the diazo resin of this invention.

The light-sensitive composition comprising the photocrosslinkable polymer may further comprise sensitizers, preferably triplet sensitizers which show a maximum absorption at a wavelength of not less than 300 nm so that the resulting light-sensitive layer practically absorb a sufficient quantity of light.

Examples of such sensitizers are benzophenone derivatives, benzanthrone derivatives, quinones, aromatic nitro compounds, naphthothiazoline derivatives, benzothiazoline derivatives, thioxanthones, naphthothiazole derivatives, ketocoumalin compounds, benzothiazole derivatives, naphthofuranone compounds, pyrylium salts and thiapyrylium salts. Specific examples thereof are Michler's ketones, N,N'-diethylaminobenzophenone, benzanthrone, (3-methyl-1,3-diaza-1,9-benz)anthrone picramide, 5-nitroacenaphthene, 2-chlorothioxanthone, 2-isopropylthioxanthone, dimethylthioxanthone, methylthioxanthone-1-ethylcarboxylate, 2-nitrofluorene, 2-dibenzoylmethylene-3-methylnaphthothiazoline, 3,3-carbonyl-bis(7-diethylaminocoumalin), 2,4,6-triphenylthiapyrylium perchlorate and 2-(p-chlorobenzoyl)naphthothiazole. These sensitizers may be used alone or as a combination thereof and the amount thereof ranges from about 1 to about 20% by weight, preferably 3 to 20% by weight on the basis of the total weight of the light-sensitive composition.

The light-sensitive composition comprising the photocrosslinkable polymer may optionally comprise a binder which is in general properly selected from linear organic polymers. Specific examples of the binder usable in the composition are chlorinated polyethylene and polypropylene, poly(alkyl acrylate), copolymers of at least one monomer selected from alkyl acrylates, acrylonitrile, vinyl chloride, styrene and butadiene with other monomers, polyamides, methyl cellulose, polyvinyl formal, polyvinyl butyral, methacrylic acid copolymers, acrylic acid copolymers and itaconic acid coplymers. The composition further comprises plasticizers such as dialkyl phthalates, for instance, dibutyl phthalate and dihexyl phthalate; oligoethylene glycol alkyl esters and phosphoric acid ester type plasticizers.

The light-sensitive composition to which the present diazo resin is incorporated may further comprise additives such as dyes, pigments, pH indicators, heat polymerization inhibitors, antioxidants or the like.

The light-sensitive composition may further comprise heat polymerization inhibitors which are preferably selected from the group consisting of hydroquinone, p-methoxyphenol, di-t-butyl-p-cresol, pyrogallol, t-butyl catechol, benzoquinone, 4,4'-thiobis(3-methy-6-t-butylphenol), 2,2'-methylenebis(4-methyl-6-t-butylphenol) and 2-mercapto-benzimidazole: pH indicators as agents or compositions for obtaining a visible image immediately after imagewise exposure; and waxing compounds for preventing polymerization inhibition effect of, for instance, oxygen atoms in the air.

The waxing compounds are solid at ordinary temperature, but soluble in a coating solution and separated out to the surface during coating/drying processes. Specific examples thereof are higher fatty acids such as stearic acid and behenic acid; and higher fatty acid amides such as stearic acid amide and behenic acid amide; as well as higher alcohols.

The light-sensitive composition of the present invention, which contains the present diazo resin, is first dissolved in a solvent and then applied onto a substrate having a hydrophilic surface, to form a light-sensitive layer. The coated amount of the light-sensitive composition usually ranges from 0.1 to 10 g/m$^2$, preferably 0.5 to 5 g/m$^2$ (on dry basis). The concentration of the light-sensitive composition of the coating solution desirably ranges from 1 to 50% by weight. The solvent includes, for instance, methyl cellosolve, ethyl cellosolve, 1-methoxy-2-propanol, dimethoxyethane, diethylene glycol monomethyl ether, diethylene glycol dimethyl ether, methyl cellosolve acetate, acetone, methyl ethyl ketone, methanol, dimethylformamide, dimethylacetamide, dimethylsulfoxide, methyl lactate, ethyl lactate, ethylene dichloride, cyclohexanone, dioxane, tetrahydrofuran, 2-methoxyethanol, 2-methoxyethyl acetate, propylene glycol monomethyl ether, 3-methoxypropanol, 3-methoxypropyl acetate, methanol, ethanol, cylohexane and mixture thereof. It is also effective to use a mixed solvent comprising both the foregoing solvents or mixture thereof and a small amount of a solvent which does not dissolve the diazo resin and other polymeric compounds, such as water or toluene.

The drying of the coated layer is desirably performed at a temperature ranging from 50° to 120° C. The layer is first subjected to a predrying process at a relatively low temperature and then is subjected to a post-drying process at a high temperature, or it may directly be dried at a high temperature if a solvent and a concentration are properly selected.

The PS plates of the present invention may optionally comprise an underlayer, in order to improve the adhesion between the light-sensitive layer and the substrate. The thickness thereof is not critical so far as the layer can undergo a uniform linkage-forming reaction with the light-sensitive layer provided thereon. However, it generally ranges from about 1 to 100 mg/m$^2$, in particular 5 to 40 mg/m$^2$.

The preferred underlayer is comprised of the present diazo resin. The underlayer may further comprise various additives such as stabilizers for the diazo resins, sensitizers, halation inhibitors, polymeric binders and surfactants. The amount of the diazo resin in the underlayer ranges from 30 to 100% by weight, preferably 60 to 100% by weight on the basis of the total weight of the underlayer.

The underlayer is usually applied onto the surface of a substrate by dissolving the diazo resin and other optional components in a proper solvent, applying the resulting solution to the substrate and then drying it. Alternatively, it can also be obtained by immersing the substrate in a solution containing the components for the underlayer and then drying it.

The substrate for PS plates having a hydrophilic surface is preferably plate-like materials having a good dimensional stability. Examples of such dimensionally stable plate-like materials include those conventionally used as substrates for lithographic printing plates. They may favorably be used in the invention. Specific examples thereof include paper; paper laminated with a plastic film such as a polyethylene, polypropylene or polystyrene film; a metal plate such as an aluminum (inclusive of aluminum alloys), zinc or copper plate; a plastic film such as cellulose diacetate, cellulose triacetate, cellulose propionate, cellulose acetate, cellulose acetate butyrate, cellulose nitrate, polyethylene terephthalate, polyethylene, polystyrene, polypropylene, polycarbonate or polyvinyl acetal film; and paper or a plastic film which is laminated with a sheet of the foregoing metal or to which a layer of such a metal is deposited. Among these substrates, an aluminum plate is preferable because of its dimensional stability, low cost and its good adhesion to the light-sensitive composition of the present invention. In addition, a composite sheets comprising polyethylene terephthalate film to which an aluminum sheet is bonded as disclosed in J. P. KOKOKU No. Sho 48-18327 may also be used.

Metal substrates, in paricular, an aluminum substrate is preferably subjected to surface treatments such as mechanical surface-roughening treatments (e.g., wire brush graining, brush graining wherein the surface of a substrate is rubbed with, for instance, a nylon brush while pouring a slurry of abrasive particles and ball graining), chemical graining in which an etchant such as HF, AlCl$_3$ or HCl is used; electrolytic graining using an electrolyte such as a nitric acid or hydrochloric acid solution; or composite graining comprising a combination thereof. Preferred aluminum plates are those obtained by graining, then optionally subjecting to an etching treatment with an acid or an alkali and subsequently anodizing the plate in an electrolyte such as sulfuric acid, phosphoric acid, oxalic acid, boric acid, chromic acid, sulfamic acid or mixture thereof using DC or AC to thus form a strong passivation layer on the aluminum plate surface. The aluminum plate surface becomes sufficiently hydrophilic due to the presence of such a passivation layer, but particularly preferred are those further subjected to the following treatments such as silicate (sodium or potassium silicate) treatments as disclosed in U.S. Pat. Nos. 2,714,066 and 3,181,461; potassium fluorozirconate treatments as disclosed in U.S. Pat. No. 2,946,638; phosphomolybdate treatments as disclosed in U.S. Pat. No. 3,201,247; alkyl titanate treatments as disclosed in British Patent No. 1,108,559; polyacrylic acid treatments as disclosed in German Patent No. 1,091,433; polyvinyl sulfonic acid treatments as disclosed in German Patent No. 1,134,093 and British Patent No. 1,230,447; phosphonic acid treatments as disclosed in J. P. KOKOKU No. Sho 44-6409; phytic acid treatments as disclosed in U.S. Pat. No. 3,307,951; composite treatments comprising hydrophilic organic polymer treatment and divalent metal treatment as disclosed in J. P. KOKAI Nos. Sho 58-16893 and Sho 58-18291; and application of an underlayer of a water-soluble polymer having a sulfonic acid residue to hydrophilize the plate surface as disclosed in J. P. KOKAI No. Sho 59-101651. Examples of other surface treatments of the aluminum substrate are silicate electrodeposition as disclosed in U.S. Pat. No. 3,658,662; anodizing treatment followed by dipping treatment in an alkali metal silicate aqueous solution as disclosed in J. P. KOKOKU No. Sho 47-5125; a combination of electrolytic graining, the foregoing anodization and sodium silicate treatments as disclosed in J. P. KOKOKU No. Sho 46-27481 and J. P. KOKAI Nos. Sho 52-58602 and Sho 52-30503; and a combination of brush graining, electrolytic graining, anodization treatments and sodium silicate treatments which are performed in this order as disclosed in J. P. KOKAI No. Sho 56-28893. Further, it is also effective to use the aluminum plate to which an underlayer such as a water-soluble resin layer (e.g., polyvinyl phosphonic acid, homopolymers and copolymers having a sulfonic acid residue at a side chain or polyacrylic acid) is applied, after it is treated according to the foregoing surface treatments.

After such graining and anodization treatments, the aluminum plate is preferably subjected to a sealing treatment. The sealing treatment can be performed by immersing the plate in hot water or a hot aqueous solution containing an organic or inorganic salt or further by a steaming treatment.

The foregoing hydrophilization treatments are performed not only for hydrophilization of the aluminum plate surface but also for preventing the occurrence of the detrimental reaction of the plate with a light-sensitive layer applied thereon and for enhancing the adhesion between the plate and the light-sensitive layer.

The PS plate of the present invention may further comprise a protective layer for completely eliminating polymerization inhibiting effect due to oxygen in the air. Examples of such a protective layer are layers of polymers excellent in oxygen barrier properties such as polyvinyl alcohol and acidic cellulose layers. Methods for applying such a protecting layer are detailed in, for instance, U.S. Pat. No. 3,458,311 and J. P. KOKOKU No. Sho 55-49729.

The PS plates of the present invention are imagewise exposed to light from a light source rich in actinic rays through a transparent original, then developed with a proper developer to obtain relief images negative to the original and coated with a gumming solution. Thus, a lithographic printing plate is prepared. Examples of the light source usable in the present invention are a carbon arc lamp, a mercury lamp, a xenon lamp, a metal halide lamp, a strobo light and a ultraviolet laser.

Any known developers may be used for developing the PS plates of the present invention, but preferred are as follows:

Desirable developers comprise at least one alkaline agent and water as an essential component.

Examples of alkaline agents are inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium carbonate, sodium bicarbonate and aqueous ammonia; organic alkaline agents such as mono-, di- and trimethylamines, mono-, di- and triethylamines, mono- and diisopropylamines, n-butylamine, mono-, di- and triethanolamines, mono-, di- and triisopropanolamines, ethyleneimine and ethylenediimine.

These alkaline agents are used in the developer in an amount ranging from 0.05 to 10% by weight, preferably 0.5 to 5% by weight. This is because if the amount is less than 0.05% by weight, the development is incomplete, while if it exceeds 10% by weight, these alkaline agents exert adverse effect on printing properties of the resulting lithographic printing plate.

The developer usable for developing the PS plates of the present invention may optionally comprise specific organic solvents and/or surfactants. In particular, it is necessary to incorporate such organic solvents when the diazo resin free of a carboxyl group is incorporated into the light-sensitive layer.

The organic solvents are preferably those which are capable of solubilizing or swelling the non-exposed areas (nonimage areas) of the light-sensitive layer during development and which have solubility in water being more than 10% by weight at ordinary temperature (about 20° C.). Examples of such organic solvents are carboxylic acid esters such as ethyl acetate, propyl acetate, butyl acetate, amyl acetate, benzyl acetate, ethylene glycol monobutyl acetate, butyl lactate and butyl levulinate; ketones such as ethyl butyl ketone, methyl isobutyl ketone and cyclohexanone; alcohols such as ethylene glycol monobutyl ether, ethylene glycol monophenyl ether, ethylene glycol benzyl ether, benzyl alcohol, methyl phenyl carbinol, n-amyl alcohol, 2-phenoxyethanol, 2-butoxyethanol, n-propyl alcohol and methyl amyl alcohol; alkyl-substituted aromatic hydrocarbons such as xylene; and halogenated hydrocarbons such as methylene chloride, ethylene dichloride and monochlorobenzene, which may be used alone or as a combination. Among these, preferred are ethylene glycol monophenyl ether and benzyl alcohol. These organic solvents are used in an amount ranging from 0 to 20% by weight, preferably 2 to 10% by weight.

The developer may comprise water-soluble sulfites, preferably water-soluble sulfites of alkali or alkaline earth metals such as sodium, potassium, lithium and magnesium. The amount of the sulfite in the developer ranges from 0 to 4% by weight, preferably 0.1 to 1% by weight.

It is also possible to use alkaline-soluble pyrazolone compounds, alkaline-soluble thiol compounds, hydroxyl group-containing aromatic compounds such as methyl resorcin or amine compounds such as phenylenediamine, in place of or in combination with the foregoing water-soluble sulfites. These additives serve, for instance, solubilizing agents for the diazo resins.

Moreover, to promote the dissolution of the foregoing orgasnic solvents in water, specific solubilizing agents may be incorporated into the developer. The solubilizing agents are preferably those having a solubility in water higher than those of the foregoing organic solvents and a molecular weight lower than the latter such as lower alcohols and ketones. Besides, anionic and amphoteric surfactants may also be used.

Preferred examples of such alcohols and ketones are methanol, ethanol, propanol, butanol, acetone, methyl ethyl ketone, ethylene glycol monomethyl ether, ethylene glycol monoethyl ether, methoxybutanol, ethoxybutanol, 4-methoxy-4-methylbutanol and N-methylpyrrolidone. In addition, examples of surfactants usable in the present invention are preferably sodium isopropylnaphthalene sulfonate, sodium n-butylnaphthalene sulfonate, sodium N-methyl-N-pentadecylaminoacetate and sodium laurylsulfate. The amount of the solubilizing agent such as alcohols and ketones is preferably not more than 30% by weight on the basis of the total weight of the developer.

The developers as disclosed in U.S. Pat. Nos. 3,475,171 and 3,615,480; J. P. KOKAI No. Sho 50-26601 and J. P. KOKOKU Nos. Sho 56-39464 and Sho 56-42860(U.S. Pat. No. 4,186,006) are preferably used for developing the PS plates of the present invention.

As has been described above in detail, the light-sensitive composition of the present invention are excellent in solubility in organic solvents used when the compositions are applied to a substrate and after coating, drying and imagewise exposing to light, unexposed areas on the resulting light-sensitive layer can be completely removed by immersing in a developer or rubbing with, for instance, a sponge containing the developer at approximately ordinary temperature to 40° C. for 10 to 60 seconds without any detrimental effect on the exposed areas of the light-sensitive layer. In other words, the light-sensitive compositions have good developability and further exhibit good storage stability and the resulting lithographic printing plate exhibits good printing durability.

Moreover, the PS plates of the present invention have a high sensitivity, can be developed with an alkaline water and can provide a lithographic printing plate showing good printing properties. Moreover, the PS plates can be developed with a conventional developers and, therefore, they can be processed in the same processing system.

The light-sensitive compositions and the PS plates of the present invention will hereunder be explained in more detail with reference to the following non-limitative working Examples, Preparation examples and the effects practically attained by the present invention will also be discussed in detail in comparison with Comparative Examples. In the following description, the term "%" means "% by weight" unless otherwise specified.

PREPARATION EXAMPLE 1

29.3 g (0.100 mole) of 4-diazodiphenylamine hydrogensulfate was dissolved in 70 ml of an 85% phosphoric acid solution. Then 4.74 g (0.0500 mole) of glyoxylic acid monohydrate (97%) was added to this solution and the mixture was stirred at 40° C. for 20 hours. Then 1.58 g (0.0500 mole) of paraformaldehyde (95%) was added to the reaction mixture and the mixture was stirred at 40° C. for additional 20 hours. Thereafter, the reaction solution was poured into 800 ml of isopropyl alcohol while stirring, to form yellow precipitate. The yellow precipitate was obtaied by filtering and washed with isopropyl alcohol, to give dihydrogenphosphate of a condensate of 4-diazodiphenylamine with glyoxylic acid.formaldehyde.

The condensate was dissolved in 400 ml of water and a solution of 41.8 g (0.120 mole) of sodium n-dodecylbenzenesulfonate in 600 ml of water was added to the resulting solution while stirring. The resulting yellow precipitate was obtained by filtering and dried, to give 44 g of n-dodecylbenzenesulfonate of the condensate of 4-diazodiphenylamine with glyoxylic acid.formaldehyde (diazo resin (a) of the present invention).

The acid value of the resulting diazo resin was 0.98 meq/g. Moreover, the diazo resin was coupled with 1-phenyl-3-methyl-5-pyrazolone, then the weight average molecular weight thereof was determined by GPC. It was 1950 (polystyrene standard).

PREPARATION EXAMPLE 2

32.3 g (0.100 mole) of 4'-methoxy-4-diazodiphenylamine hydrogensulfate was dissolved in 70 ml of an 85% phosphoric acid solution. Then 6.64 g (0.0700 mole) of glyoxylic acid monohydrate (97%) was added to this solution and the mixture was stirred at 40° C. for 20 hours. Then 3.96 g (0.0900 mole) of acetaldehyde was added to the reaction mixture and the mixture was stirred at 40° C. for additional 20 hours. Thereafter, the reaction solution was poured into 800 ml of isopropyl alcohol while stirring, to give yellow precipitate. The yellow precipitate was obtained by filtering and washed with isopropyl alcohol, to give dihydrogenphosphate of of a condensate of 4'-methoxy-4-diazodiphenylamine with glyoxylic acid.acetaldehyde.

The condensate was dissolved in 400 ml of water and a solution of 39.6 g (0.120 mole) of sodium 2-methoxy-4-hydroxy-5-benzoybenzenelsulfonate in 600 ml of water was added to the resulting solution while stirring. The resulting yellow precipitate was collected by filtering and dried, to give 39 g of 2-methoxy-4-hydroxy-5-benzoybenzenelsulfonate of the condensate of 4'-methoxy-4-diazodiphenylamine with glyoxylic acid.acetaldehyde (diazo resin (b) of the present invention).

The acid value of the resulting diazo resin was 1.10 meq/g. Moreover, the diazo resin was coupled with 1-phenyl-3-methyl-5-pyrazolone, then the weight average molecular weight thereof was determined by GPC and it was 1730 (polystyrene standard).

PREPARATION EXAMPLE 3

29.3 g (0.100 mole) of 4-diazodiphenylamine hydrogensulfate was dissolved in 70 ml of 96% sulfuric acid. Then 16.5 g (0.110 mole) of terephthalaldehydic acid was added to this solution and the mixture was stirred at 5° C. for 3 hours. Thereafter, the reaction solution was poured into 800 ml of isopropyl alcohol while stirring, to form yellow precipitate. The yellow precipitate was collected by filtering and washed with isopropyl alcohol, to give dihydrogensulfate of a condensate of 4-diazodiphenylamine with terephthalaldehydic acid.

The condensate was suspended in a mixture of 200 ml of water and 500 ml of MEK and a solution of 41.8 g (0.120 mole) of sodium n-dodecylbenzenesulfonate in 600 ml of water was added to the resulting suspension while stirring. When the suspension was stirred for a while and then allowed to stand, it separated into two phases. The upper phase was poured into 2 l of water while stirring and the resulting yellow precipitate was collected by filtering and dried, to give 46 g of n-dodecylbenzenesulfonate of the condensate of 4-diazodiphenylamine with terephthalaldehydic acid (diazo resin (c) of the present invention).

The acid value of the resulting diazo resin was 0.89 meq/g. Moreover, the diazo resin was coupled with 1-phenyl-3-methyl-5-pyrazolone, then the weight average molecular weight thereof was determined by GPC. It was found to be 1450 (polystyrene standard).

PREPARATION EXAMPLE 4

32.3 g (0.100 mole) of 4-diazo-3-methoxydiphenylamine hydrogensulfate was dissolved in 100 ml of an 96% sulfuric acid. Then 3.16 g (0.100 mole) of paraformaldehyde (95%) was added to this solution and the mixture was stirred at 5° C. for 2 hours. Then 7.50 g (0.0500 mole) of terephthalaldehydic acid was added to the reaction mixture and the mixture was stirred at 5° C. for additional 2 hours. Thereafter, the reaction solution was poured into 800 ml of isopropyl alcohol while stirring, to from yellow precipitate. The yellow precipitate was collected by filtering and washed with isopropyl alcohol, to give hydrogensulfate of a condensate of 4-diazo-3-methoxydiphenylamine with formaldehyde.terephthalaldehydic acid.

The condensate was dissolved in 400 ml of water and a solution of 22.1 g (0.120 mole) of potassium hexafluorophosphate in 600 ml of water was added to the resulting solution while stirring. The resulting yellow precipitate was collected by filtering and dried to give 28 g of hexafluorophosphate of the condensate of 4-diazo-3-methoxydiphenylamine with formaldehyde.terephthalaldehydic acid (diazo resin (d) of the present invention).

The acid value of the resulting diazo resin was 0.54 meq/g. Moreover, the diazo resin was coupled with 1-phenyl-3-methyl-5-pyrazolone, then the weight average molecular weight thereof was determined by GPC. It was found to be 2300 (polystyrene standard).

PREPARATION EXAMPLE 5

37.4 g (0.100 mole) of 4'-methyl-2,5-dimethoxy-4-diazodiphenyl-sulfide hydrogensulfate was dissolved in 70 ml of an 96% sulfuric acid. Then 4.64 g (0.0400 mole) of glutaraldehydic acid (4-formyl butanoic acid) was added to this solution and the mixture was stirred at 5° C. for 2 hours. Then 1.90 g (0.0600 mole) of paraformaldehyde (95%) was added to the reaction mixture and the mixture was stirred at 5° C. for additional 2 hours. Thereafter, the reaction solution was poured into 1.5 l of ice water while stirring and 260 g of a 50% aqueous solution of zinc chloride was added there to form yellow precipitate. The yellow precipitate was collected by filtering to give a zinc chloride complex salt of a condensate of 4'-methyl-2,5-dimethoxy-diazodiphenyl-sulfide with glutaraldehydic acid.formaldehyde.

The condensate was dissolved in 800 ml of water and a solution of 22.1 g (0.120 mole) of potassium hexafluorophosphate in 600 ml of water was added to the resulting solution while stirring. The resulting yellow precipitate was collected by filtering and dried to give 50 g of hexafluorophosphate of the condensate of 4'-methyl-2,5-dimethoxy-diazodiphenylsulfide with glutaraldehydic acid.formaldehyde (diazo resin (e) of the present invention).

The acid value of the resulting diazo resin was 0.77 meq/g. Moreover, the diazo resin was coupled with 1-phenyl-3-methyl-5-pyrazolone, then the weight average molecular weight thereof was determined by GPC. It was found to be 2130 (polystyrene standard).

PREPARATION EXAMPLE 6

Preparation of Polymeric Compound 1 Having Sulfonamido Group

To a 1 l three-necked flask equipped with a stirring machine, a condenser and a dropping funnel, there were introduced 170.2 g (1.0 mole) of p-aminobenzenesulfonamide and 700 ml of tetrahydrofuran, and the mixture was stirred while cooling it in an ice-water bath. 52.3 g (0.5 mole) of methacrylic acid chloride was dropwise added to the mixture through the dropping funnel over about one hour. After the dropwise addition, the flask was removed from the ice-water bath and the content thereof was stirred at room temperature for 30 minutes and further stirred for additional one hour while heating it to 60° C. in an oil bath. After completion of the reaction, the reaction mixture was poured into 3 l of water while stirring. The stirring was continued for 30 minutes and then the mixture was filtered to give white solid of N-(p-aminosulfonylphenyl) methacrylamide. The white solid thus obtained was purified by recrystallization from ethanol-acetone mixed solvent (yield 39.3 g).

Then 4.57 g (0.0192 mole) of N-(p-aminosulfonylphenyl) methacrylamide, 2.55 g (0.0480 mole) of acrylonitrile, 1.66 g (0.0192 mole) of methacrylic acid, 11.36 g (0.1136 mole) of ethyl acrylate. 0.41 g of $\alpha, \alpha'$-azobisisobutyronitrile and 25 g of N,N-dimethylformamide were introduced into a 100 ml three-necked flask equipped with a stirring machine and a condenser and were stirred for 5 hours while warming the mixture at 64° C. The reaction mixture was poured into 2 l of water, stirred for 30 minutes, filtered and dried to give 16 g of the intented polymeric compound 1. The weight average molecular weight of the polymeric compound was determined by GPC (polystyrene standard) and it was found to be 35,000.

PREPARATION EXAMPLE 7

Preparation of Polymeric Compound 2 Having Sulfonamido Group 4.57 g (0.0192 mole) of N-(p-aminosulfonylphenyl) methacrylamide, 6.25 g (0.0480 mole) of 2-hydroxyethyl acrylate, 1.66 g (0.0192 mole) of methacrylic acid, 11.36 g (0.1136 mole) of ethyl acrylate, 0.41 g of $\alpha, \alpha'$-azobisisobutyronitrile and 29 g of N,N-dimethylformamide were introduced into a 100 ml three-necked flask equipped with a stirring machine and a condenser, and were stirred for 5 hours while warming the mixture at 64° C. The reaction mixture was poured into 2 l of water, stirred for 30 minutes, filtered and dried to give 20 g of the intended polymeric compound 2. The weight average molecular weight of the polymeric compound was determined by GPC (polystyrene standard) and it was found to be 44,000.

PREPARATION EXAMPLE 8

Preparation of Polyurethane Resin (a) Having Sulfonamido Group

Into a 500 ml three-necked flask equipped with a stirring machine, a condenser and a dropping funnel, there were introduced 40 g (0.298 mole) of 2,2-bis(hydroxymethyl)propionic acid and 100 ml of acetic anhydride and the mixture was stirred while cooling it in an ice-water bath. 100 ml of pyridine was dropwise added to the mixture through the dropping funnel over about 30 minutes. After the dropwise addition, the flask was removed from the ice-water bath and the content thereof was stirred for additional two hours while heating it to 60° C. in an oil bath. After completion of the reaction, the reaction mixture was acidified with the addition of hydrochloric acid and extracted with chloroform using a separatory funnel. The chloroform phase was washed with water and then dried over anhydrous sodium sulfate. The solvent was removed from the solution by distillation under reduced pressure to give white solid of 2,2-bis(acetoxymethyl)propionic acid (yield 57 g).

Then 30 g (0.137 mole) of 2,2-bis(acetoxymethyl)propionic acid and 20 ml of thionyl chloride were introduced into a 300 ml three-necked flask equipped with a stirring machine, a condenser and a dropping funnel and the mixture was stirred at 80° C. for 2 hours while heating.

After completion of the reaction, unreacted thionyl chloride was sufficiently removed by distillation under reduced pressure, the residue (reaction product) was immersed in ice-water bath to sufficiently cool the reaction product. To the reaction product, there were dropwise added a mixture comprising 46.6 g (0.274 mole) of p-aminobenzenesulfonamide and 150 ml of tetrahydrofuran through the dropping funnel over about one hour. After the dropwise addition, the content of the flask was stirred for two hours while heating to 60° C. in an oil bath. After completion of the reaction, the reaction mixture was poured into 2 l of water while stirring, then stirred for 30 minutes and filtered to give white solid of p-(1,1-bis(acetoxymethyl)ethylcarbonylamino)benzenesulfonamide. The white solid was purified by recrystallization from ethanol (yield 26 g).

Then, 22 g (0.06 mole) of p-(1,1-bis(acetoxymethyl)ethylcarbonylamino)benzenesulfonamide, 4.8 g (0.12 mole) of sodium hydroxide, 50 ml of ethanol and 50 ml of water were introduced into a 300 ml three-necked flask equipped with a stirring machine and a condenser and refluxed while heating for 2 hours. The reaction mixture was poured into 1 l of water while stirring, then stirred for 30 minutes and filtered to give white solid of p-(1,1-bis(hydroxymethyl)ethylcarbonylamino)benzenesulfonamide. The white solid was purified by recrystallization from ethanol (yield 11 g).

3.44 g (0.012 mole) of p-(1,1-bis(hydroxymethyl)ethylcarbonyl-amino)benzenesulfonamide, 1.07 g (0.008 mole) of 2,2-dihydroxy-methyl propionic acid, 5.26 g (0.021 mole) of 4,4'-diphenylmethane diisocyanate and 18 g of N,N-dimethylacetamide were introduced into a 100 ml three-necked flask equipped with a stirring machine and a condenser and were stirred for 4 hours with heating at 100° C. The reaction mixture was cooled, 5 ml of methanol was added thereto, the mixture was stirred for a while, then poured into 500 ml of water while stirring and further stirred for 30 minutes. The precipitate thus formed was collected by filtering and dired to give 9 g of white solid of the intended polyurethane resin. The weight average molecular weight of the polyurethane resin was determined by GPC (polystyrene standard) and it was found to be 64,000 (polyurethane resin (a)).

PREPARATION EXAMPLES 9 to 12

Preparation of Polyurethane Resins (b) to (e) Having Sulfonamido Group

Diisocyanate compounds and diol compounds as listed in the following Table 1 were reacted to obtain the corresponding polyurethane resins (b) to (e). Each of the resulting polyurethane resins had a weight average molecular weight (polystyrene standard) ranging from 25,000 to 70,000.

PREPARATION EXAMPLE 13

Preparation of Polyurethane Resin (f) Having Sulfonamido Group

Into a 1l three-necked flask equipped with a stirring machine, a condenser and a dropping funnel, there were introduced 98.5 g (0.8 mole) of o-aminobenzyl alcohol and 500 ml of acetone and the mixture was stirred while cooling in an NaCl-ice bath. A solution of 27.5 g (0.1 mole) of m-benzenedisulfonyl chloride in 200 ml acetone was dropwise added to the mixture through the dropping funnel over about one hour. After the dropwise addition, the flask was removed from the NaCl-ice bath and the content thereof was stirred at room temperature for two hours. After completion of the reaction, most of the acetone was removed by distillation under reduced pressure and the residue (reaction product) was poured into 1 l of water and then acidified with hydrochloric acid. The precipitate was collected by filtration and dissolved in an aqueous solution of sodium hydroxide. After removing impurities by filtration, the filtrate was introduced into a separatory funnel and washed twice with ethyl acetate. The water phase was acidified with the addition of hydrochloric acid and the precipitate was collected by filtration. The precipitate thus obtained was sufficiently washed with water and dried to give solid of N,N'-bis(o-hydroxymethylphenyl)benzene-m-disulfonamide (yield 30.6 g).

Then, 6.28 g (0.014 mole) of N,N'-bis(o-hydroxymethylphenyl)benzene-m-disulfonamide, 0.80 g (0.006 mole) of 2,2-dihydroxymethyl propionic acid, 5.26 g (0.021 mole) of 4,4'-diphenylmethane diisocyanate and 18 g of N,N-dimethylacetamide were introduced into a 100 ml three-necked flask equipped with a stirring machine and a condenser and were stirred for 3 hours while heating at 100° C. After completion of the reaction, this reaction mixture was stirred for a while after the addition of 5 g of methanol, then the mixture was poured into 500 ml of water while stirring and further stirred for 30 minutes. The precipitate thus formed was filtered and dried to give 12 g of white solid of the intended polyurethane resin. The weight average molecular weight of the polyurethane resin was determined by GPC (polystyrene standard) and it was found to be 55,000 (polyurethane resin (f)).

PREPARATION EXAMPLES 14 TO 16

Preparation of Polyurethane Resin (g) to (i) Having Sulfonamido Group

Diisocyanate compounds and diol compounds as listed in the following Table 1 were reacted to obtain the corresponding polyurethane resins (g) to (i). The resulting polyurethane resins had a weight average molecular weight (polystyrene standard) ranging from 32,000 to 88,000.

TABLE 1

| No. | Diisocyanate Compound | Diol Compound |
|---|---|---|
| b | OCN—CH₂—(m-C₆H₄)—CH₂—NCO | HOCH₂C(CH₃)(CO-NH-C₆H₄-SO₂NH₂)CH₂OH 60 mol % / HOCH₂C(CH₃)(COOH)CH₂OH 40 mol % |
| c | (trimethyl cyclohexyl) OCN—...—CH₂NCO with CH₃, CH₃, CH₃, H | " |
| d | OCN—C₆H₄—CH₂—C₆H₄—NCO 50 mol % / OCN—(CH₂)₆—NCO 50 mol % | |
| e | OCN—C₆H₄—CH₂—C₆H₄—NCO | HOCH₂CH₂N(CO-CH₂-CH₂-NHSO₂CH₃)CH₂CH₂OH 65 mol % / HOCH₂C(CH₃)(COOH)CH₂OH 35 mol % |
| g | OCN—(CH₂)₆—NCO | HO-C₆H₄-NH-SO₂-(m-C₆H₄)-SO₂-NH-C₆H₄-OH |
| h | OCN—CH₂—(m-C₆H₄)—CH₂—NCO | HO-C₆H₄-NH-SO₂-(m-C₆H₄)-SO₂-NH-C₆H₄-OH 70 mol % / HO—(CH₂)₄—OH 30 mol % |

TABLE 1-continued

| No. | Diisocyanate Compound | Diol Compound |
|---|---|---|
| i | OCN—⌬—CH₂—⌬—NCO | HO⊣CH₂⊢₂NHSO₂—⌬—SO₂NH⊣CH₂⊢₂OH / HOCH₂C(CH₃)(COOH)CH₂OH<br>70 mol % / 30 mol % |

EXAMPLE 1

The surface of an aluminum plate having a thickness of 0.24 mm was grained with a nylon brush and an aqueous suspension of 400 mesh pumice stone and then washed with water sufficiently. The plate was etched by immersing it in a 10% aqueous sodium hydroxide solution at 70° C. for 60 seconds, washed with running water, neutralized and washed with 20% nitric acid and then washed with water. The plate was then electrolytically surface-roughened in a 1% aqueous solution of nitric acid according to the method disclosed in J.P. KOKAI No. Sho 53-67507, more specifically under the conditions of $V_a = 12.7$ V and $V_c = 9.1$ V so that the quantity of electricity at the anode time was 160 coulombs/dm², using sinusoidal alternating current. Subsequently, the plate was immersed in a 30% aqueous solution of sulfuric acid at 55° C. for 2 minutes to desmut and was anodized in a 7% aqueous solution of sulfuric acid so that the amount of aluminum oxide layer formed is equal to 2.0 g/m². Then, it was immersed in a 3% aqueous solution of sodium silicate maintained at 70° C. for one minute, washed with water and dried. A solution of a light-sensitive composition whose composition is listed below (hereunder referred to as "light-sensitive solution") was applied onto the surface of the aluminum plate thus treated with a whirler and the coated layer was dried at 80° C. for 2 minutes. The coated amount (on dry basis) was found to be 2.0 g/m².

The diazo resins used in the following light-sensitive solution will be listed in Table 2 given below.

Light-sensitive Solution

| Component | Amount (g) |
|---|---|
| Diazo resin (see Table 2) | 0.5 |
| N-(4-hydroxyphenyl) acrylamide/acrylonitrile/ethyl acrylate/methacrylic acid (molar ratio: 10/20/60/10) | 5.0 |
| Oil-soluble dye (Victoria Pure Blue BOH) | 0.1 |
| Malic Acid | 0.05 |
| 2-Methoxyethanol | 100 |

The same procedures used above were repeated except that the following diazo resins were substituted for the diazo resin used in Example 1 to form Comparative Samples 1 and 2. The coated amount was 2.0 g/m² (on dry basis).

Diazo Resins Used in Comparative Samples

Comparative Sample 1: n-Dodecylbenzenesulfonate of a condensate of 4-diazo-diphenylamine with formaldehyde (carboxylic acid value=0 meq/g; wt. average Mw=1,900)

Comparative Sample 2: Hexafluorophosphate of a condensate of 4-diazo-3-methoxy-diphenylamine with formaldehyde (carboxylic acid value=0 meq/g; wt. average Mw=2,200).

Evaluation of Background Contamination

Each PS plate thus prepared was imagewise exposed to light from PS Light (available from Fuji Photo Film Co., Ltd.) at a distance of 1 m therefrom for one minute, immersed in a developer having the following composition at room temperature for one minute, followed by rubbing the surface thereof with absorbent wadding lightly to remove the un-exposed areas to thus obtain lithographic printing plates (I) to (VII) having clear blue images.

Developer

| Component | Amount (g) |
|---|---|
| Sodium sulfite | 5 |
| Benzyl alcohol | 30 |
| Sodium carbonate | 5 |
| Sodium isopropylnaphthalenesulfonate | 12 |
| Water | 1000 |

Each lithographic printing plate thus prepared was mounted to KOR printing press (available from Heiderberg Co., Ltd.) and printing operation was performed using a commercially available ink and wood-free paper.

Background contamination observed in each lithographic printing plate was evaluated according to the following four-stage evaluation standard. The results obtained are summarized in the following Table 2.

TABLE 2

| PS plate | Diazo Resin | Evaluation |
|---|---|---|
| (I) | diazo resin (a) | A |
| (II) | diazo resin (b) | A |
| (III) | diazo resin (c) | A |
| (IV) | diazo resin (d) | B |
| (V) | diazo resin (e) | A |
| (VI) | diazo resin of Comp. Sample 1 | B ~ C |
| (VII) | diazo resin of Comp. Sample 2 | C |

A: no background contamination is observed at all;
B: almost no background contamination is observed;
C: background contamination is observed in some degree;
D: background contamination is observed in substantial degree.

As seen from the results listed in Table 2, the lithographic printing plates (I) to (V) obtained from the light-sensitive composition of the present invention did not cause background contamination and were very excellent as compared with Comparative PS plates (VI) and (VII).

EXAMPLE 2

The same procedures as in Example 1 were repeated except that diazo resins and polymeric compounds (binder) listed in Table 3 were used instead of those used in Example 1 to form PS plates (VIII) to (XIII). The PS plates were likewise processed in the same manner as in Example 1 to obtain lithographic printing plates and the same printing operations were performed to evaluate background contamination according to the above evaluation standard. The results thus obtained are summarized in Table 3 given below.

TABLE 3

| PS plate | Diazo Resin | Polymeric Compound | Evaluation |
|---|---|---|---|
| (VIII) | Resin (a) | polymeric compound 1 | A |
| (IX) | Resin (a) | polymeric compound 2 | A |
| (X) | Resin (a) | polyurethane resin (a) | A |
| (XI) | Resin (a) | polyurethane resin (f) | A |
| (XII) | Resin of Comp. Sample 1 | polymeric compound 1 | B ~ C |
| (XIII) | Resin of Comp. Sample 1 | polyurethane resin (a) | C |

As seen from the results listed in Table 3, the lithographic printing plates (VIII) to (XI) obtained from the light-sensitive composition of the present invention did not cause background contamination and were very excellent as compared with Comparative PS plates (XII) and (XIII).

EXAMPLE 3

Each PS plate prepared in Example 1 was imagewise exposed to light from PS Light (available from Fuji Photo Film Co., Ltd.) at a distance of 1 m therefrom for one minute, immersed in a developer having the following composition at room temperature for one minute, followed by rubbing the surface thereof with absorbent wadding lightly to remove the unexposed areas to thus obtain lithographic printing plates (XIV) to (XX) having clear blue images.

Developer

| Component | Amount (g) |
|---|---|
| Sodium silicate (molar ratio. SiO$_2$/Na$_2$O. = about 1.1) | 20 |
| Water | 1000 |

As in Example 1, each lithographic printing plate thus obtained was mounted to KOR printing press (available from Heiderberg Co., Ltd.) and printing operation was performed using a commercially available ink and wood-free paper.

Background contamination observed in each lithographic printing plate was evaluated according to the above evaluation standard as in Example 1. The results obtained are summarized in the following Table 4.

TABLE 4

| PS plate | Diazo Resin | Evaluation |
|---|---|---|
| (XIV) | diazo resin (a) | A |
| (XV) | diazo resin (b) | A |
| (XVI) | diazo resin (c) | A |
| (XVII) | diazo resin (d) | B |
| (XVIII) | diazo resin (e) | B |
| (XIX) | diazo resin of Comp. Sample 1 | C |
| (XX) | diazo resin of Comp. Sample 2 | D |

As seen from the results listed in Table 4, the lithographic printing plates (XIV) to (XVIII) obtained from the light-sensitive composition of the present invention did not cause background contamination and were very excellent as compared with Comparative PS plates (XIX) and (XX).

EXAMPLE 4

In the same manner as in Example 3, PS plates (XXI) to (XXVI) were prepared except that diazo resins and polymeric compounds (binders) listed in the following Table 5 were employed instead of those of Example 3, lithographic printing plates were obtained and printing operations were performed to evaluate background contamination. The results obtained are summarized in Table 5.

TABLE 5

| PS plate | Diazo Resin | Polymeric Compound | Evaluation |
|---|---|---|---|
| (XXI) | Resin (a) | polymeric compound 1 | A |
| (XXII) | Resin (a) | polymeric compound 2 | B |
| (XXIII) | Resin (a) | polyurethane resin (a) | B |
| (XXIV) | Resin (a) | polyurethane resin (f) | B |
| (XXV) | Resin of Comp. Sample 1 | polymeric compound 1 | C |
| (XXVI) | Resin of Comp. Sample 1 | polyurethane resin (a) | D |

As seen from the results listed in Table 5, the lithographic printing plates (XXI) to (XXIV) obtained from the light-sensitive composition of the present invention did not cause any background contamination and are very excellent as compared with Comparative PS plates (XXV) and (XXVI).

EXAMPLE 5

The same procedures as in Example 1 were repeated except that the following light-sensitive solution was used.

Light-sensitive Solution

| Component | Amount (g) |
|---|---|
| Diazo resin (see Table 6 below) | 0.5 |
| Copolymer of 2-hydroxyethylmethacrylate/ acrylonitrile/ethylmethacrylate/ methacrylic acid (molar ratio: 35/25/35/5) | 5.0 |
| Oil-soluble dye (Victoria Pure Blue BOH) | 0.1 |
| Malic acid | 0.05 |
| 1-Methoxy-2-propanol | 50 |
| Methyl ethyl ketone | 50 |

Each of the PS plates was imagewise exposed to light from PS Light (available from Fuji Photo Film Co., Ltd.) at a distance of 1 m therefrom for one minute, with a transparant negative original and step wedge (optical density is increased by 0.150 step by step) contacting the PS plate. Then, the PS plate was developed with the following developer at room temperature for 30 seconds. Solid step of the resultant lithographic printing plate was determined. The results are also shown in Table 6.

Developer

| Sodium sulfite | 5 g |
|---|---|
| Benzyl alcohol | 30 g |
| Sodium carbonate | 5 g |
| Sodium isopropylnaphthalene sulfonate | 12 g |
| Water | 1000 g |

Separately, each of the PS plates was imagewise exposed to light from PS Light (available from Fuji Photo Film Co., Ltd.) at a distance of 1 m therefrom for one minute, immersed in the above developer at room temperature for one minute, followed by rubbing the surface thereof with absorbent wadding lightly to remove the unexposed areas to thus obtain a lithographic printing plate having clear blue images.

The resultant lithographic printing plate was mounted to KOR printing press (available from Heiderberg Co., Ltd.) and printing operation was performed using a commercially available ink and wood-free paper.

The results of sensitivity and background contamination are shown in Table 6.

TABLE 6

| PS plate | Diazo resin | Solid Step | Evaluation |
|---|---|---|---|
| (XXVII) | diazo resin (a)/ diazo resin (1)* (30/70 weight ratio) | 5.0 | A |
| (XXVIII) | diazo resin (a)/ diazo resin (1) (50/50 weight ratio) | 5.0 | A |
| (XXIX) | diazo resin (a)/ diazo resin (1)* (70/30 weight ratio) | 5.0 | A |
| (XXX) | diazo resin (b)/ diazo resin (1) (50/50 weight ratio) | 4.5 | A |
| (XXXI) | diazo resin (2)*/ diazo resin (1) (50/50 weight ratio) | 4.0 | C |
| (XXXII) | diazo resin (a) | 3.0 | A |
| (XXXIII) | diazo resin (1) | 3.5 | B ~ C |
| (XXXIV) | diazo resin (2) | 3.5 | C |

*Diazo resin (1) is a diazo resin free of a carboxyl group, namely hexafluorophosphate of a condensate of 4-diazodiphenylamine with formaldehyde (carboxylic acid value: 0 and weight average molecular weight: 1900).
*Diazo resin (2) is a diazo resin free of carboxyl group, namely dodecylbenzenesulfonate of a condensate of 4-diazodiphenylamine with formaldehyde (carboxylic acid value: 0 and weight average molecular weight: 1900).

The results in Table 6 show taht the PS Plates of the present invention (XXVII) to (XXX) have higher sensitivity and less contamination at printing operation than those of comparative samples (XXXI) to (XXXIV).

EXAMPLE 6

The surface of an aluminum plate having a thickness of 0.3 mm was grained with a nylon brush and an aqueous suspension of 400 mesh pumice stone and then washed with water sufficiently. The plate was etched by immersing it in a 10% aqueous sodium hydroxide solution at 70° C. for 60 seconds, washed with running water, neutralized and washed with 20% nitric acid and then washed with water. The plate was electrolytically surfaceroughened in a 1% aqueous solution of nitric acid under the condition of Va=12.7 V so that the quantity of electricity at the anode time was 160 coulombs/dm$^2$, using sinusoidal alternating current. The surface roughness of the plate was determined at this stage and it was found to be 0.6μ (expressed in the Ra unit). Subsequently, the plate was immersed in a 30% aqueous solution of sulfuric acid at 55° C. for 2 minutes to desmut and anodized in a 20% aqueous solution of sulfuric acid at a current density of 2 A/dm$^2$ for 2 minutes so that the amount of aluminum oxide layer formed is equal to 2.7 g/m$^2$. Then it was immersed in a 2.5% aqueous solution of sodium silicate maintained at 70° C. for one minute, washed with water and dried.

Then, the following diazo resin solution was applied onto the surface of the resultant aluminum plate with a whirler so that the coated amount of the solution (on dry basis) was 20 mg/m$^2$ to thus form an underlayer.

Diazo resin solution

| Component | Amount (g) |
|---|---|
| Diazo resin (a) (Preparation Example 1) | 0.1 |
| Methanol | 150 |
| Pure water | 50 |

A light-sensitive coating solution having the following composition (photopolymerizable composition) was applied onto the resulting underlayer with a whirler and dried at 80° C. for two minutes to obtain a light-sensitive layer. The coated amount (on dry basis) was found to be 2.0 g/m$^2$.

Photopolymerizable Composition (1)

| Component | Amount (g) |
|---|---|
| Poly(allyl methacrylate/methacrylic acid) (molar ratio = 70/30) | 5.0 |
| Pentaerythritol tetraacrylate | 1.5 |
| Lophine dimer/Michler's ketone (combined photopoly-merization initiator) | 0.3/0.3 |
| p-Methoxyphenol | 0.01 |
| Oil Blue #603 (available from ORIENT CHEMICAL INDUSTRIES, Ltd.) | 0.15 |
| Megafac F-177 (fluorine atom-containing surfactant available from DAINIPPON INK AND CHEMICALS, INC.) | 0.05 |
| Ethylene glycol monomethyl ether | 100 |
| Methanol | 50 |
| Methyl ethyl ketone | 50 |

Finally, a 3% by weight aqueous solution of polyvinyl alcohol for a top coat (having a degree of saponification ranging from 86.5 to 89.0 mole % and a degree of polymerization of not more than 1,000) was applied onto the surface of the light-sensitive layer with a whirler so that the coated amount thereof was 1.5 g/m$^2$ (on dry basis) to thus obtain PS plate (A).

COMPARATIVE EXAMPLE 1

The same procedures as in Example 5 were repeated except that the coating solution of the photopolymerizable composition (1) was directly applied to the surface of the aluminum plate without applying any underlayer and that a top coat was not formed to thus obtain PS plate (B).

A gray scale tablet (available from Fuji Photo Film Co., Ltd.) and a negative film having half-tone dots were superimposed on each PS plate (A) or (B), the resulting assembly was imagewise exposed to light for 50 counts with Printer FT 26V 2UPNS equipped with a 2 KW metal halide lamp as a light source (available from U.S. Nu Arc Co., Ltd.), immersed in a developer having the following composition, then rubbing the surface with absorbent wadding and washed with water.

Developer

| Component | Amount (g) |
|---|---|
| Sodium silicate (molar ratio, SiO$_2$/Na$_2$O, = about 1:1) | 20 |
| Sodium isopropylnaphthalenesulfonate | 5 |
| Pure water | 1000 |

The resulting lithographic printing plates (A) and (B) each was fitted to KOR-D printing press (available from Heiderberg Co., Ltd.) and printing was performed. The results obtained are summarized in Table 7 given below.

TABLE 7

| PS Plate | Sensitivity | Resistance to Defects During Development | Printing Durability No. of Printed Matter |
|---|---|---|---|
| (A) | 10 | good | 50,000 |
| (B) | 9.0 | defects are observed | 35,000 |

The results listed in Table 7 indicate that the PS plate of the present invention shows high sensitivity and is excellent in the adhesion between the substrate and the light-sensitive layer and resistance to defects during development and that the lithographic printing plate obtained from the PS plate of this invention exhibits high printing durability.

EXAMPLE 7

The same procedures used in Comparative Example 1 were repeated except that a coating solution obtained from the following light-sensitive composition (2) was used to obtain PS plate (C). The coated amount of the solution was 2.0 g/m$^2$ (on dry basis).

Light-sensitive Composition (2)

| Component | Amount (g) |
|---|---|
| Poly(allyl methacrylate/benzyl methacrylate/methacrylate acid) (molar ratio = 60/20/20) | 5.0 |
| Trimethylolpropane triacrylate | 2.0 |
| Polymerization initiator having the following formula: | 0.3 |
| Behenic acid amide | 0.2 |
| Oil Blue #603 (available from ORIENT CHEMICAL INDUSTRIES, Ltd.) | 0.15 |
| Malic acid | 0.05 |
| Diazo resin (b) of the present invention | 0.3 |
| Megafac F-117 (fluorine atom-containing surfactant available from DAINIPPON INK AND CHEMICALS, INC.) | 0.05 |
| Ethylene glycol monomethyl ether | 100 |
| Methanol | 50 |
| Methyl ethyl ketone | 50 |

COMPARATIVE EXAMPLES 2 to 3

The same procedures as in Example 7 were repeated except that the foregoing coating solution from which the diazo resin (b) of the present invention was removed was used, to obtain PS plate (D). Likewise, the same procedures as in Example 7 were repeated except that n-dodecylbenzenesulfonate of a condensate of p-diazodiphenylamine with formaldehyde was substituted for the diazo resin (b) of the present invention to thus form PS plate (E).

These PS plates (C) to (E) were imagewise exposed to light, developed to obtain lithographic printing plates and printing operations were performed using these plates in the same manner as in Example 6. The results obtained are listed in Table 8 given below.

TABLE 8

| PS plate | Sensitivity | Resistance to Defects during Development | Printing Properties — No. of Printed Matter | Printing Properties — Background Contamination |
|---|---|---|---|---|
| (C) | 10.0 | good | 60,000 | good |
| (D) | 8.0 | defects observed | 40,000 | good |
| (E) | 10.0 | good | 60,000 | contaminated |

The results listed in Table 8 indicate that the PS plate of the present invention shows a high sensitivity and the lithographic printing plate (C) has a good printing durability and a high resistance to contamination.

EXAMPLE 8

The surface of an aluminum plate having a thickness of 0.3 mm was grained with a nylon brush and an aqueous suspension of 400 mesh pumice stone and then washed with water sufficiently. The plate was etched by immersing in a 10% aqueous sodium hydroxide solution at 70° C. for 60 seconds, washed with running water, neutralized and washed with 20% nitric acid and then washed with water. The plate was then electrolytically surface-roughened in a 1% aqueous solution of nitric acid under the condition of Va=12.7 V so that the quantity of electricity at the anode time was 160 coulombs/dm$^2$, using a sinusoidal alternating current. The surface roughness of the plate was determined at this stage and it was found to be 0.6μ (Ra unit). Subsequently, the plate was immersed in a 30% aqueous solution of sulfuric acid at 55° C. for 2 minutes to desmut and anodized in a 20% aqueous solution of sulfuric acid at a current density of 2 A/dm$^2$ for 2 minutes so that the amount of aluminum oxide layer formed was equal to 2.7 g/m$^2$. Then, it was immersed in a 2.5% aqueous solution of sodium silicate maintained at 70° C. for one minute, washed with water and dried.

Then the following diazo resin solution was prepared:

Diazo Resin Solution

| Component | Amount (g) |
|---|---|
| Diazo resin (a) (Preparation Example 1) | 0.1 |
| Methanol | 150 |
| Pure water | 50 |

The diazo resin solution was applied onto the surface of the aluminum plate with a whirler so that the coated amount of the solution (on dry basis) was 10 mg/m$^2$ and dried at 80° C. for one minute to thus form an underlayer.

A light-sensitive coating solution having the following composition (photocrosslinkable composition (3)) was applied onto the resulting intermediate layer with a whirler and dried at 80° C. for two minutes to obtain PS plate (F). The coated amount (determined after drying) was found to be 1.5 g/m$^2$.

Photocrosslinkable Composition (3)

| Component | Amount (g) |
|---|---|
| Copolymer of methy-methacrylate/N-(2-(methacryloyloxy)ethyl)-2,3-dimethylmaleimide methacrylate acid (molar ratio = 10/60/30) | 5.0 |
| Sensitizer of the following formula: | 0.25 |

-continued

| Component | Amount (g) |
|---|---|

[Structure: H3C-substituted thioxanthone with COOC2H5 group]

| Propylene glycol monomethyl ether | 50 |
| Methyl ethyl ketone | 50 |
| Megafac F-177 (fluorine atom-containing surfactant available from DAINIPPON INK AND CHEMICALS, INC.) | 0.03 |
| Copper phthalocyanin pigment (CI Pigment Blue 15) solution to which 10% of a plasticizer is dispersed | 1.0 |

COMPARATIVE EXAMPLE 4

The same procedures as in Example 8 were repeated except that an underlayer was not applied to obtain PS plate (G).

COMPARATIVE EXAMPLE 5

The same procedures as in Example 8 were repeated except that a solution containing the following diazo resin, which had been used conventionally, was applied to the surface of the aluminum plate to form an underlayer. Thus, PS plate (H) was obtained.

Composition of the Solution

| Component | Amount (g) |
|---|---|
| n-Dodecylbenzenesulfonate of a condensate of p-diazodiphenyl-amine with formaldehyde | 0.1 |
| Methanol | 150 |
| Pure water | 50 |

A step wedge (density difference=0.15 and number of steps=15) and a negative original having half-tone dots were superimposed on each of these PS plates (F) to (H) and each plate was imagewise exposed to light by irradiating it with rays from a 2 KW super high pressure mercury lamp for 60 seconds with a vacuum printing frame. Then, these plates were developed by immersing than in a 5% by weight aqueous solution of sodium silicate for about one minute.

After washing with water and drying the plates, each of the resulting lithographic printing plates was mounted to KOR-D printing press (available from Heiderberg Co., Ltd.) and printing operations were performed. Various properties were determined and the results obtained were listed in the following Table 9.

TABLE 9

| PS plate | Sensitivity Max. No. of Step Wedge | Resistance to Defects during Development | Printing Properties | |
|---|---|---|---|---|
| | | | Printing Durability | Background Contamination |
| (F) | 10 | good | 60,000 | not observed |
| (G) | 7 | defects on image portions | 30,000 | not observed |
| (H) | 10 | good | 60,000 | contaminated |

The results listed in Table 9 clearly indicate that the PS plate (F) of the present invention shows a high sensitivity and the lithographic printing plate obtained therefrom has good properties during printing, i.e., a good durability and a high resistance to background contamination.

EXAMPLE 9

As in Comparative Example 4, the following light-sensitive composition (4) was applied to the surface of an aluminum plate and dried to obtain PS plate (J).

Light-sensitive Composition (4)

| Component | Amount (g) |
|---|---|
| Copolymer of N-[2-(methacryloyloxy)ethyl]-2,3-dimethylmaleimide/methacrylic acid (molar ratio = 65/35) | 5 |
| Sensitizer of the following formula: | 0.3 |

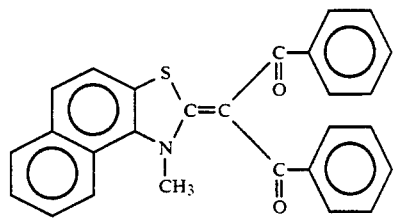

| Diazo resin (b) (Preparation Example 2) | 0.2 |
| Dipicolinic acid | 0.05 |
| Propylene glycol monomethyl ether | 50 |
| Methyl ethyl ketone | 50 |
| Megafac F-177 (fluorine atom-containing surfactan available from DAINIPPON INK AND CHEMICALS, INC. | 0.03 |
| Oil Blue #603 (available from ORIENT CHEMICAL INDUSTRIES, LTD.) | 0.15 |

COMPARATIVE EXAMPLE 6

The same procedures as in Example 9 were repeated except that the light-sensitive composition (4) from which the diazo resin (b) was removed was used to obtain PS plate (K).

The PS plates (J) and (K) were imagewise exposed to light and developed in the same manner as in Example 8 and each of the resulting lithographic printing plates was mounted to a printing press and printing operations were performed in the same manner as in Example 8. The results obtained are summarized in Table 10 given below.

TABLE 10

| PS plate | Sensitivity Max. No. of Step Wedge | Resistance to Defects during Development | Printing Properties | |
|---|---|---|---|---|
| | | | Printing Durability | Background Contamination |
| (J) | 9.0 | good | 50,000 | not observed |
| (K) | 5.0 | defects observed | 20,000 | not observed |

EXAMPLE 10

As in Example 8, a solution of a diazo resin having the following composition was applied to the surface of an aluminum plate and then dried to form an underlayer.

Diazo Resin Solution

| Component | Amount (g) |
|---|---|
| Diazo resin (c) (Preparation Example 3) | 0.2 |

| Component | Amount (g) |
|---|---|
| Ethylene glycol monomethyl ether | 200 |
| Megafac F-177 (fluorine atom-containing surfactant available from DAINIPPON INK AND CHEMICALS, INC.) | 0.3 |

Then, a light-sensitive composition (5) having the following composition was prepared.

Light-sensitive Composition (5)

| Component | Amount (g) |
|---|---|
| Copolymer of β-Cinnamoyloxyethyl methacrylate/methacrylic acid (molar ratio = 70/30) | 5.0 |
| Sensitizer of the following formula: | |

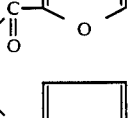

| | |
|---|---|
| Diethyl phthalate | 0.5 |
| Copper phthalocyanin pigment (CI Pigment Blue 15) solution to which 10% of a plasticizer is dispersed | 1.0 |
| Megafac F-177 (fluorine atom-containing surfactant available from DAINIPPON INK AND CHEMICALS, INC.) | 0.02 |
| Methyl ethyl ketone | 20 |
| Methanol | 2 |
| Propylene glycol monomethyl ether | 28 |

The light-sensitive composition (5) was applied to the resulting underlayer with a whirler so that the coated amount was 1.0 g/m² (on dry basis) and then dried at 80° C. for 2 minutes to thus obtain PS plate (L).

COMPARATIVE EXAMPLE 7

The same procedures as in Example 10 were repeated except that PF₆ salt of a condensate of p-diazodiphenylamine with formaldehyde was substituted for the diazo resin (c) in the diazo resin solution to obtain PS plate (M). Moreover, the same procedures as in Example 9 were repeated except that any diazo resins were not used to obtain PS plate (N).

The PS plates (L) to (N) were imagewise exposed to light and developed in the same manner as in Example 7 and each of the resulting lithographic printing plates was mounted to a printing press and printing operations were performed in the same manner as in Example 8. The results obtained are summarized in Table 11 given below.

TABLE 11

| PS plate | Sensitivity Max. No. of Step Wedge | Resistance to Defects during Development | Printing Properties | |
|---|---|---|---|---|
| | | | Printing Durability | Background Contamination |
| (L) | 9.0 | good | 50,000 | not observed |
| (M) | 9.0 | good | 50,000 | contaminated |
| (N) | 5.0 | defects are observed | 20,000 | not observed |

The results listed in Table 11 clearly indicate that the PS plate (L) of the present invention shows a high sensitivity and the lithographic printing plate obtained therefrom has good properties during printing, i.e., a good durability and a high resistance to background contamination.

What is claimed is:

1. A light-sensitive composition comprising a diazo resin having at least one repeating unit represented by the following general formula (I):

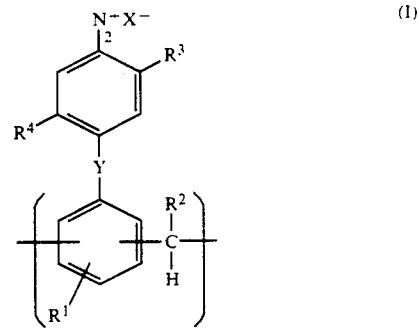

wherein $R^1$ represents a hydrogen atom, an alkyl group, an alkoxy group, a hydroxyl group, a carboxy ester group or a carboxyl group; $R^2$ represents a carboxyl group or a group having at least one carboxyl group; $R^3$ and $R^4$ each represents a hydrogen atom or an alkyl group or an alkoxy group; X⁻ represents an anion; and Y represents —NH—, —O— or —S—.

2. The light-sensitive composition of claim 1 wherein, in the general formula (I), $R^1$ is a hydrogen atom, an alkyl group having 1 to 5 carbon atoms, an alkoxy group having 1 to 3 carbon atoms or a hydroxyl group; $R^2$ is a carboxyl group or a group having at least one carboxyl group and not more than 15 carbon atoms; $R^3$ and $R^4$ each represents a hydrogen atom or an alkoxy group having 1 to 3 carbon atoms; X⁻ is an anion of an organic or inorganic acid having a pKa value of not more than 4; and Y is —NH—.

3. The light-sensitive composition of claim 2 wherein X⁻ is an anion of hexafluorophosphoric acid, methanesulfonic acid, dodecylbenzenesulfonic acid or 2-methoxy-4-hydroxy-5-benzoylbenzenesulfonic acid.

4. The light-sensitive composition of claim 1 wherein the diazo resin is one obtained by condensing a diazo monomer having a 4-diazodiphenylamine, 4-diazodiphenyl ether or 4-diazodiphenylsulfide skeleton with an aldehyde or acetal thereof represented by the following general formula (II):

(wherein $R^5$ represents a single bond, a divalent aliphatic or aromatic hydrocarbon group or a divalent heterocyclic group, which has 1 to 14 carbon atoms and which may be substituted with an alkyl group, an aryl group, an alkoxy group, an aryloxy group, a halogen atom, a hydroxyl group, a substituted or unsubstituted amino group, a carboxy ester group and/or a carboxyl group).

5. The light-sensitive composition of claim 4 wherein said diazo monomer is selected from the group consisting of 4-diazodiphenylamine, 4'-hydroxy-4-diazodiphenylamine, 4'-methoxy-4-diazodiphenylamine, 4'-ethoxy-4-diazodiphenylamine, 4'-n-propoxy-4-diazodiphenylamine, 4-i-propoxy-4-diazodiphenylamine, 4'-methyl-4-diazodiphenylamine, 4'-ethyl-4-diazodiphenylamine, 4'-n-propyl-4-diazodiphenylamine, 4'-i-propyl -4-diazodiphenylamine, 4'-n-butyl-4-diazodiphenylamine, 4'-hydroxymethyl-4-diazodiphenylamine, 4'-β-hydroxyethyl-4-diazodiphenylamine, 4'-γ-hydroxypropyl-4-diazodiphenylamine, 4'-methoxymethyl-4-diazodiphenylamine, 4'-ethoxymethyl-4-diazodiphenylamine, 4'-β-methoxyethyl-4-diazodiphenylamine, 4'-β-ethoxyethyl-4-diazodiphenylamine, 4'-carbomethyl-4-diazodiphenylamine, 4'-carboethoxy-4-diazodiphenylamine, 4'-carboxy-4-diazodiphenylamine, 4-diazo-3-methoxy-diphenylamine, 4-diazo-2-methoxy-diphenylamine, 2'-methoxy-4-diazodiphenylamine, 3-methyl-4-diazodiphenylamine, 3-ethyl-4-diazodiphenylamine, 3'-methyl-4-diazodiphenylamine, 3-ethoxy-4-diazodiphenylamine, 3-hexyloxy-4-diazodiphenylamine, 3-β-hydroxyethoxy-4-diazodiphenylamine, 2-methoxy-5'-methyl-4-diazodiphenylamine, 4-diazo-3-methoxy-6-methyldiphenylamine, 3,3'-dimethyl-4-diazodiphenylamine, 3'-n-butoxy-4-diazodiphenylamine, 3,4'-dimethoxy-4-diazodiphenylamine, 2'-carboxy-4-diazodiphenylamine, 4-diazodiphenyl ether, 4'-methoxy-4-diazodiphenyl ether, 4'-methyl-4-diazodiphenyl ether, 3,4'-dimethoxy-4-diazodiphenyl ether, 4'-carboxy-4-diazodiphenyl ether, 3,3'-dimethyl-4-diazodiphenyl ether, 4-diazodiphenyl sulfide, 4'-methyl-4-diazodiphenyl sulfide and 4'-methyl-2,5-dimethoxy-4-diazodiphenyl sulfide.

6. The light-sensitive composition of claim 4 wherein said aldehyde or acetal is selected from the group consisting of glyoxylic acid, malonaldehydic acid, succinaldehydic acid, 2-methylsuccinaldehydic acid, 2-methoxysuccinaldehydic acid, 2-hydroxysuccinaldehydic acid, 2-chlorosucinaldehydic acid, 2-aminosuccinaldehydic acid, glutaraldehydic acid, 2-methylglutaraldehydic acid, 2-methoxyglutaraldehydic acid, 2-hydroxyglutaraldehydic acid, 2-chloroglutaraldehydic acid, adipinaldehydic acid, pimeladehydic acid, suberaldehydic acid, azelainaldehydic acid, sebacinaldehydic acid, 2-formylmethylsuccinic acid, 2-formylethylsuccinic acid, formylmethylamalonic acid, formylethylmalonic acid, N-(2-formyl-2-hydroxyethyl)glycine, N-(2-formyl-2-hydroxyvinyl)glycine, 4,6-dioxo-hexanoic acid, 6-oxo-2,4-hexadienic acid, 3-formylcyclohexanecarboxylic acid, 4-formylphenylacetic acid, malealdehydic acid, fumaraldehydic acid, dibromomalealdehydic acid, glucuronic acid, galacturonic acid, mannuronic acid, iduronic acid, guluronic acid, phthalaldehydic acid, 3,4-dimethoxyphthalaldehydic acid, isophthalaldehydic acid, terephthalaldehydic acid, 3-formyl-4-methoxybenzoic acid, 4-formylphthalic acid, 5-formylisophthalic acid, 4-formylmethylphathalic acid, 4-formylethylphthalic acid, 4-formylethoxyphthalic acid, 5-formylethoxyisophthalic acid, 4-carboxymethylphthalic acid, 3-formyl-1-naphthoic acid, 6-formyl-1-naphthoic acid and their acetals.

7. The light-sensitive composition of claim 1 wherein the diazo resin has a weight average molecular weight ranging from about 1,000 to 10,000.

8. The light-sensitive composition of claim 1 wherein the amount of the diazo resin ranges from 3 to 20% by weight on the basis of the total weight of the composition.

9. The light-sensitive composition of claim 1 further comprising an organic solvent-soluble polymeric compound.

10. The light-sensitive composition of claim 9 wherein said organic solvent-soluble polymeric compound is selected from the group consisting of acrylic resins, methacrylic resins, polyvinyl acetal resins, polyurethane resins, polyamide resins, epoxy resins, polystyrene type resins, polyether resins, polyester resins, polycarbonate resins and phenolic resins.

11. The light-sensitive composition of claim 9 wherein said organic solvent-soluble polymeric compound is (i) a copolymer having a sulfonamido group which has a molecular weight ranging from 20,000 to 150,000 and comprises a structural unit derived from a monomer represented by any of the following general formulae (III) to (V):

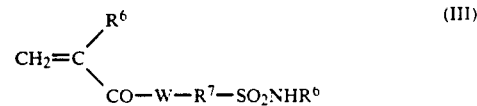

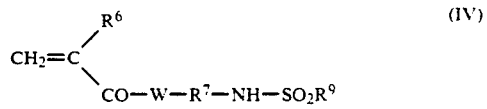

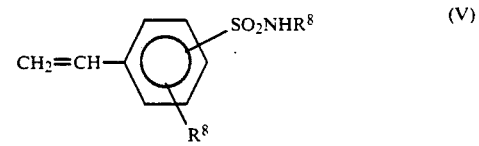

(wherein $R^6$ represents a hydrogen atom or a methyl group; $R^7$ represents a $C_1$ to $C_{12}$ alkylene, cycloalkylene, arylene or aralkylene group, which may be substituted; —W— represents —O— or —N($R^{10}$)—; $R^8$ and $R^{10}$ each represents a hydrogen atom or a $C_1$ to $C_{12}$ alkyl, cycloalkyl, aryl or aralkyl group, which may be substituted; $R^9$ represents a $C_1$ to $C_{12}$ alkyl, cycloalkyl, aryl or aralkyl group, which may be substituted) or (ii) a polyurethane resin containing a sulfonamide group at a side chain or in the main chain.

12. The light-sensitive composition of claim 11 wherein said copolymer having a sulfonamide group comprises:

(a) 1 to 40 mole % of a structural unit represented by the following general formula (VI):

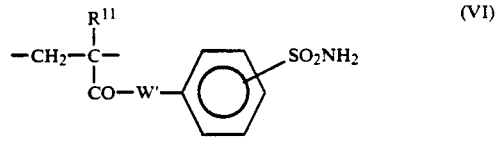

wherein $R^{11}$ represents a hydrogen atom or a methyl group; W' represents —O— or —NH—;

(b) 5 to 40 mole % of a structural unit represented by the following general formula (VII):

wherein $R^{12}$ represents a hydrogen atom or a methyl group;

(c) 0 to 40 mole % of a structural unit derived from methacrylic acid and/or acrylic acid; and (d) 20 to 70 mole % of a structural unit represented by the following general formula (VIII):

wherein $R^{13}$ represents a hydrogen atom or a methyl group; and $R^{14}$ represents an alkyl group having 1 to 12 carbon atoms, an aryl group or an aryl-substituted alkyl group; and whose weight average molecular weight ranges from 20,000 to 150,000.

13. The light-sensitive composition of claim 11 wherein said polyurethane resin has a basic skeleton obtained by reacting a polyol compound having at least one sulfonamido group in a molecule with a polyisocyanate compound.

14. The light-sensitive composition of claim 13 wherein said polyurethane resin is a polyurethane resin having a basic skeleton derived from a reaction product of a diol compound having a sulfonamido group represented by any of the following general formulae (X) to (XIII) with a diisocyanate compound:

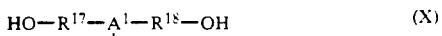
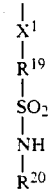

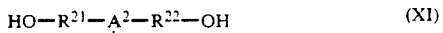
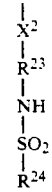

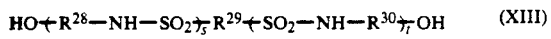

wherein $R^{17}$, $R^{18}$, $R^{19}$, $R^{21}$, $R^{22}$ and $R^{23}$ may be the same as or different from each other and represent a single bond or a $C_1$ to $C_{20}$ alkylene or $C_6$ to $C_{15}$ arylene group which may have a substituent and they may have another functional group selected from ester, urethane, amido, ureido and ether groups having no reactivity with an isocyanate group, provided that two or three thereof may form a ring; $R^{20}$ represents a $C_1$ to $C_8$ alkyl group, a $C_6$ to $C_{15}$ aryl group or an aralkyl group; $R_{24}$ represents a $C_1$ to $C_8$ alkyl group, a $C_6$ to $C_{15}$ aryl group or an aralkyl group; $A^1$ and $A^2$ each represents a nitrogen atom or a trivalent $C_1$ to $C_{20}$ aliphatic or aromatic group which may have a substituent; $X^1$ and $X^2$ each represents a single bond or a divalent coupling group consisting of at least one atom selected from the group consisting of C, H, N, O and S; $R^{25}$ to $R^{30}$ may be the same as or different from each other and represent a $C_1$ to $C_{20}$ alkylene group, an aralkylene group or an arylene group which may have another functional group selected from ester, urethane, amido, ureido and ether groups having no reactivity with an isocyanate group; and k, l, s and t each represents 0 or 1, provided that $k+l \neq 0$ and $s+t \neq 0$.

15. The light-sensitive composition of claim 11 wherein said polyurethane resin has a weight average molecular weight ranging from 5,000 to 300,000 and a number average molecular weight ranging from 2,000 to 250,000 and a polydispersity index ranging from 1.1 to 10.

16. A light-sensitive composition comprising a polymerizable compound having an ethylenically unsaturated bond, a photopolymerization initiator, an alkaline water-soluble or swellable and film-forming polymeric compound and the diazo resin of claim 1.

17. The light-sensitive composition of claim 16 wherein said polymerizable compound having an ethylenically unsaturated bond is selected from unsaturated carboxylic acid and salts thereof, esters of unsaturated carboxylic acids with aliphatic polyhydric alcohols and amides of unsaturated carboxylic acids with aliphatic polyvalent amines.

18. The light-sensitive composition of claim 17 wherein said polymerizable compound having an ethylenically unsaturated bond is selected from the group consisting of (meth)acrylic acid, itaconic acid, crotonic acid, isocrotonic acid, maleic acid and sodium and potassium salts thereof; ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, polyester acrylate oligomers; tetramethylene glycol dimethacrylate, triester glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypropoxy)phenyl]-dimethylmethane, bis-[p-(methacryloxyethoxy)phenyl]dimethylmethane; ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate; ethylene glycol dicrotonate, tetramethylene glycol dicrotonate, pentaerythritol dicrotonate, sorbitol tetracrotonate; ethylene glycol diisocrotonate, pentaerythritol diisocrotonate, sorbitol tetraisocrotonate; ethylene glycol dimaleate, triethylene glycol dimaleate, pentaerythritol dimaleate, sorbitol tetramaleate; methylenbis-(meth)acrylamide, 1,6-hexamethylenebis-(meth)acrylamide, diethylenetriaminetrisacrylamide, xylylenebismethacrylamide; and vinyl urethane compounds having at least two polymerizable vinyl groups per molecule obtained by adding vinyl monomers having a hydroxyl group represented by the following general formula (A)

to polyisocyanate compounds having at least two isocyanate groups in the molecule:

CH$_2$=C(R)COOCH$_2$CH(R')OH         (A)

wherein R and R' each represents a hydrogen atom or a methyl group.

19. The light-sensitive composition of claim 16 wherein said polymerization initiator is selected from the group consisting of vicinal polyketaldonyl compounds, α-carbonyl compounds, acyloin ether compounds, aromatic acyloin compounds substituted with a hydrocarbon group at the α-position, polynuclear quinone compounds, combination of triarylimidazole dimers/paminophenyl ketone, benzothiazole type compounds, combination of benzothiazole type compounds/trihalomethyl-s-triazine type compounds, acridine and phenadine compounds, and oxadiazole compounds.

20. The light-sensitive composition of claim 16 wherein said alkaline water-soluble or swellable and film-forming polymer is selected from copolymers of benzyl (meth)acrylate/(meth)acrylic acid/optional another addition polymerizable vinyl monomers; and copolymers of allyl (meth)acrylate/(meth)acrylic acid-/optional another addition polymerizable vinyl monomers.

21. The light-sensitive composition of claim 20 wherein said alkaline water-soluble or swellable polymer and film-forming has a molecular weight ranging from 10,000 to 500,000.

22. A light-sensitive composition comprising an alkaline water-soluble or swellable and photocrosslinkable polymer and the diazo resin of claim 1.

23. The light-sensitive composition of claim 22 wherein said photocrosslinkable polymer is selected from those having maleimido, cinnamyl, cinnamoyl, cinnamylidene, cinnamylideneacetyl and/or chalcone groups at a side chain or in the main chain.

24. The light-sensitive composition of claim 23 wherein said photocrosslinkable polymer is selected from those having, at a side chain, a maleimido group represented by the following general formula (XV):

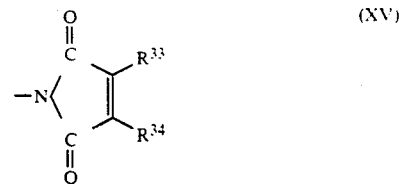

(wherein R$^{33}$ and R$^{34}$ each independently represents an alkyl group having at most 4 carbon atoms or R$^{33}$ and R$^{34}$ may be bonded together to form a 5- or 6-membered carbon ring); and those having, at a side chain, a maleimido group represented by the following general formula (XVI):

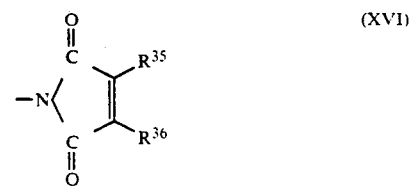

(wherein R$^{35}$ represents an aromatic group; R$^{36}$ represents a hydrogen or halogen atom, an alkyl group or a cyano group), which have an average molecular weight ranging from 30,000 to 40,000 and which are made alkaline water-soluble or swellable by introducing, into the polymer, an acid group selected from the group consisting of carboxyl, sulfonic acid, phosphoric acid groups; these groups which are in the form of alkali metal salts or ammonium salts; and —SO$_2$NHCO—, —CONHCO—, —SO$_2$NHCOO— and phydroxyphenyl groups which dissociate in an alkaline water and have a pKa value ranging from 6 to 12.

25. The light-sensitive composition of claim 20 wherein said photocrosslinkable polymer has a molecular weight ranging from 20,000 to 300,000.

* * * * *